United States Patent [19]

Sugahara et al.

[11] Patent Number: 4,822,752
[45] Date of Patent: Apr. 18, 1989

[54] PROCESS FOR PRODUCING SINGLE CRYSTAL SEMICONDUCTOR LAYER AND SEMICONDUCTOR DEVICE PRODUCED BY SAID PROCESS

[75] Inventors: Kazuyuki Sugahara; Tadashi Nishimura; Shigeru Kusunoki; Yasuo Inoue, all of Hyogo, Japan

[73] Assignee: Agency of Industrial Science and Technology, Tokyo, Japan

[21] Appl. No.: 22,717

[22] Filed: Mar. 6, 1987

[30] Foreign Application Priority Data

Mar. 7, 1986 [JP] Japan .................................. 61-48470
Mar. 7, 1986 [JP] Japan .................................. 61-48471
May 24, 1986 [JP] Japan .................................. 61-118438

[51] Int. Cl.⁴ ................. H01L 21/306; H01L 21/326; H01L 21/479
[52] U.S. Cl. ..................................... 437/174; 437/173; 437/84; 437/907; 437/908; 437/943; 437/973; 148/DIG. 90; 148/DIG. 91; 148/DIG. 93; 219/121.6; 219/121.65; 219/121.66; 204/157.41
[58] Field of Search .............. 148/1.5, 175, DIG. 90, 148/DIG. 91, DIG. 93; 29/571, 576 E, 576 T; 427/86; 219/121 L, 121 LE, 121 LF; 437/973, 173, 174, 84, 82, 907, 908, 943; 204/157.15, 157.4, 157.41

[56] References Cited

U.S. PATENT DOCUMENTS

| 4,234,358 | 11/1980 | Celler et al. ................. 148/175 |
| 4,309,225 | 1/1982 | Fan et al. .................... 29/576 E |
| 4,330,363 | 5/1982 | Biegelsen et al. ........ 156/DIG. 88 |
| 4,415,383 | 11/1983 | Naem et al. ................. 29/571 |
| 4,431,459 | 2/1984 | Teng ............................. 148/1.5 |
| 4,514,895 | 5/1985 | Nishimura ................. 29/576 T |
| 4,523,962 | 6/1985 | Nishimura ................... 148/1.5 |
| 4,545,823 | 10/1985 | Drowley ..................... 148/1.5 |
| 4,619,034 | 10/1986 | Janning ..................... 148/1.5 |

FOREIGN PATENT DOCUMENTS 4212087 7/1967 Japan .

OTHER PUBLICATIONS

Douglas, "The Route to 3-D Chips", High Technology, Sep. 1983, pp. 55-59.
Celler et al., "Seeded Oscillatory Growth of Si over SiO₂ by CW Laser Irradiation," Appl. Phys. Lett., vol. 40, No. 12, pp. 1043-1045.

(List continued on next page.)

Primary Examiner—Brian E. Hearn
Assistant Examiner—M. Wilezewski
Attorney, Agent, or Firm—Bernard, Rothwell & Brown

[57] ABSTRACT

Disclosed herein is a process for producing a single crystal layer of a semiconductor device, which comprises the steps of providing an oxide insulator layer separated by an opening part for seeding, on a major surface of a single crystal semiconductor substrate of the cubic system, providing a polycrystalline or amorphous semiconductor layer on the entire surface of the insulator layer inclusive of the opening part, then providing a protective layer comprising at least a reflective or anti-reflection film comprising strips of a predetermined width, in a predetermined direction relative to the opening part and at a predetermined interval, the protective layer capable of controlling the temperature distributions in the semiconductor layer at the parts corresponding to the stripes or the parts not corresponding to the stripes, thereby completing a base for producing a semiconductor device, thereafter the surface of the base is irradiated with an energy beam through the striped reflective or anti-reflection film to melt the polycrystalline or amorphous semiconductor and scanning the energy beam in a predetermined direction such that the direction of the crystal of the semiconductor re-solidified and converted into a single crystal accords with a {111} plane, to produce the single crystal of the semiconductor device. Also disclosed is a semiconductor device produced by the method, which comprises a single crystal layer having a wide range of a crystal in a predetermined direction relative to the facial orientation of the major surface of the substrate, and has a three-dimensional semiconductor circuit element construction.

16 Claims, 17 Drawing Sheets

OTHER PUBLICATIONS

Smith, "Britian Getting its Act Together in SOI Technology in Bid to Get Jump on U.S. and Japanese Chip Makers," Electronics Week, Aug. 6, 19 84, pp. 31–33.

Akiyama et al., "Multilayer CMOS Device Fabricated on Laser Recrystallized Silicon Islands", IEDM, 1983, pp. 352–353.

Ghandhi, *VLSI Fabrication Principles,* John Wiley and Sons, Inc. 1983.

Sugahara et al., "Orientation Control of the Silicon Film on Insulator by Laser Recrystallization", scheduled for publication in the J. of App. Phys., Nov. 15, 1987.

Sugahara et al., "Orientation Control of SOI Film by Laser Recrystallization", Extended Abstracts of the 18th (1986 International) Conference on Solid State Devices and Materials, Tokyo, 1986, pp. 565–568.

Inoue et al., "Formation of Large Area SOI Layer by Laser Recrystallization", Japan Electronic Communication Society, Sep. 19, 1986, pp. 91–96.

H. W. Lam et al., "Single Crystal Silicon-on-Oxide by a Scanning CW Laser Induced Lateral Seeding Process", J. Electrochem. Soc., vol 128, Sep. 1981, pp. 1981–1986.

J. P. Colinge et al., "Use of Selective Annealing for Growing Very Large Grain Silicon on Insulator Films", Appl. Phys. Lett 41(4), Aug. 15, 1982 pp. 346–347.

M. W. Geis et al., "Zone-Melting Recrystallization of Si Film with a Moveable Strip-Heater Oven", J. Electrodes. Soc., vol. 124, Dec. 1982, pp. 2812–2828.

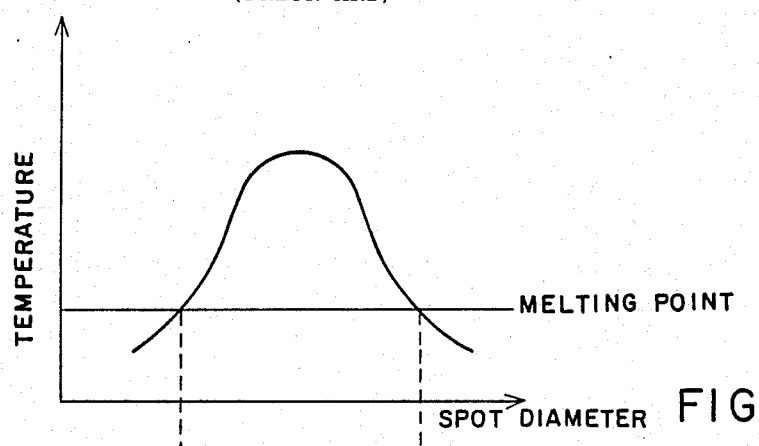
FIG. 2A
(PRIOR ART)
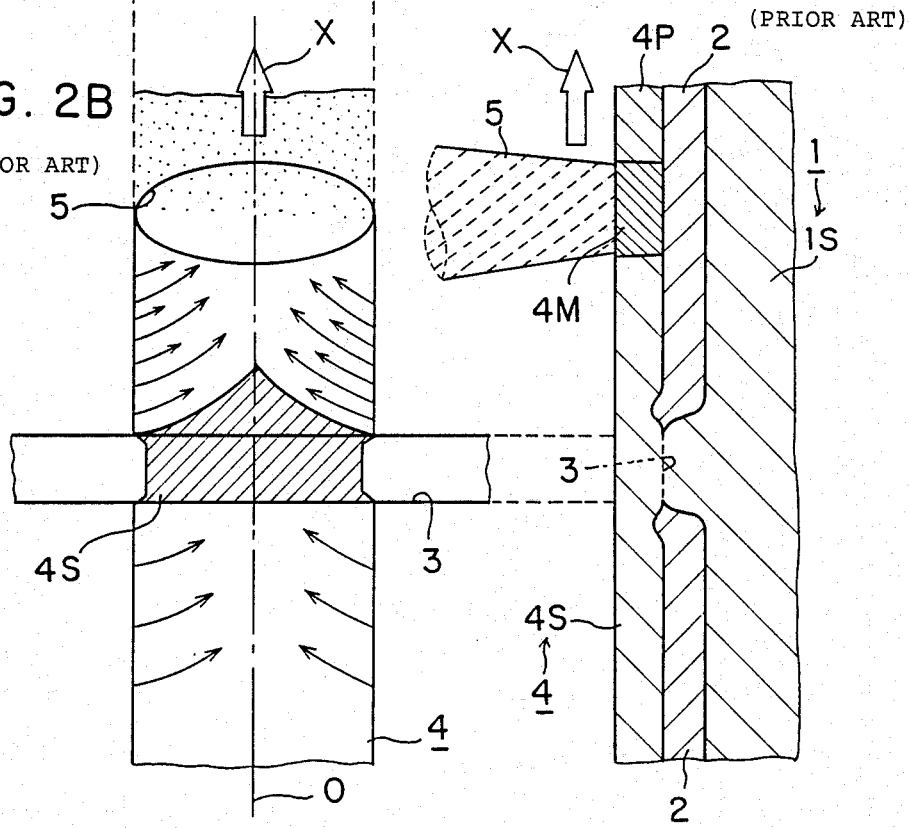
FIG. 2B
(PRIOR ART)
FIG. 2C
(PRIOR ART)

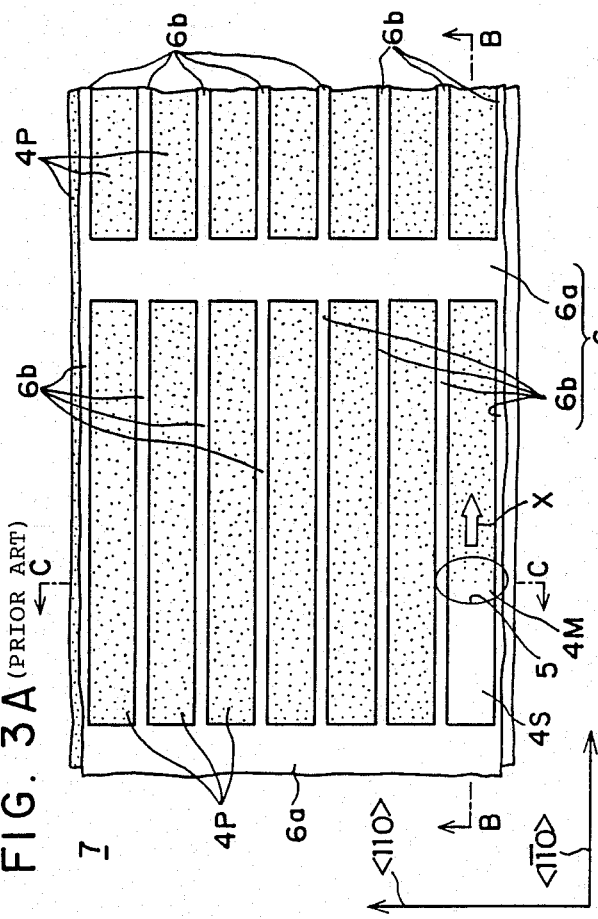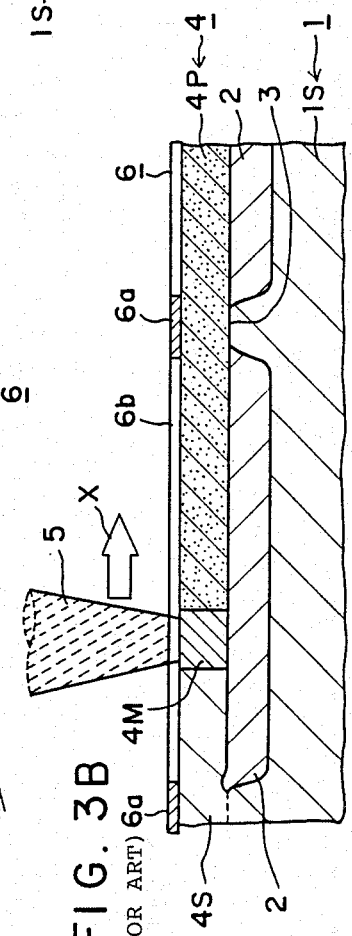
FIG. 3A (PRIOR ART)
FIG. 3B (PRIOR ART)
FIG. 3C (PRIOR ART)

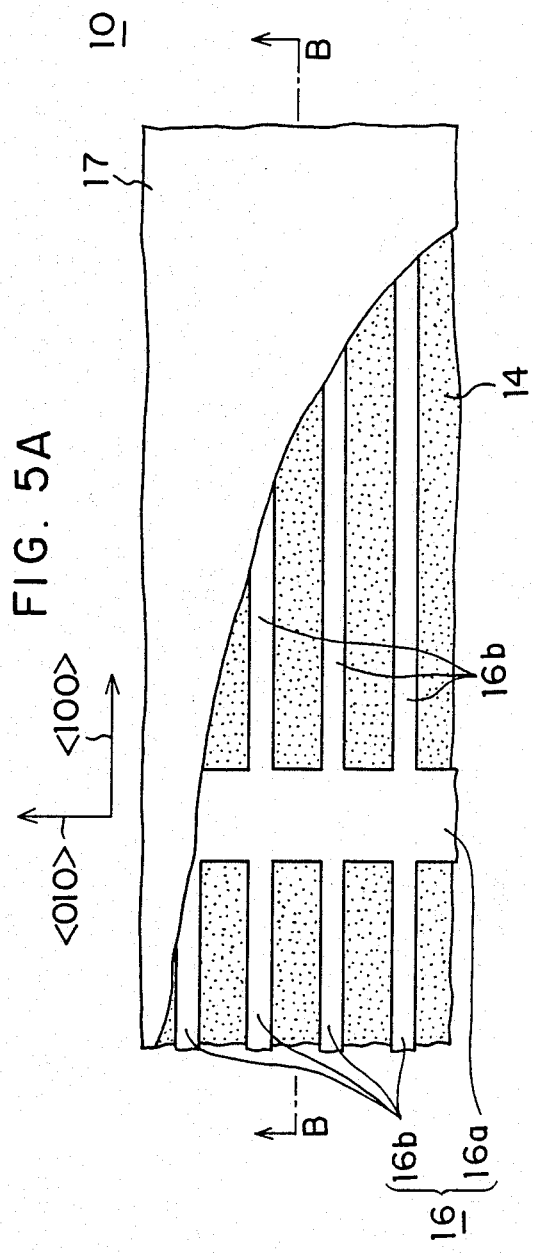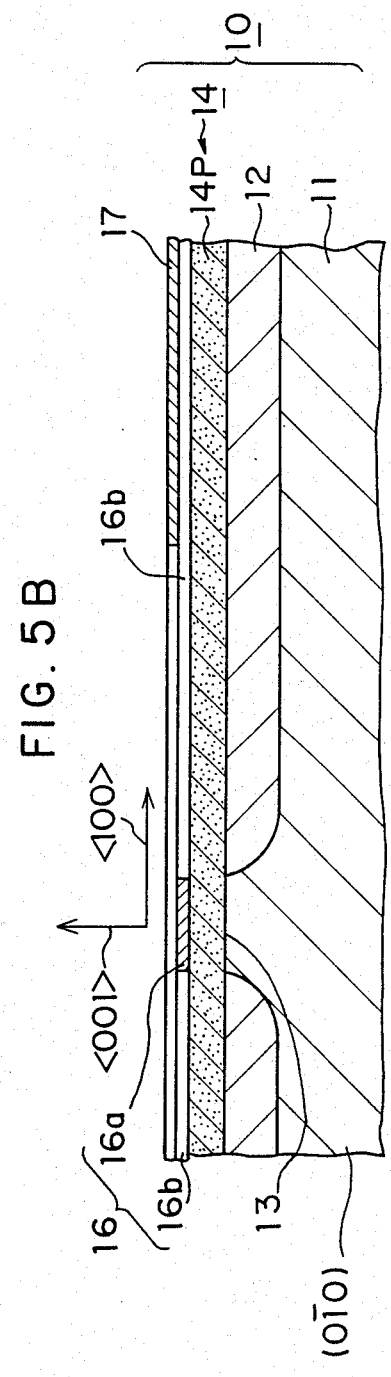

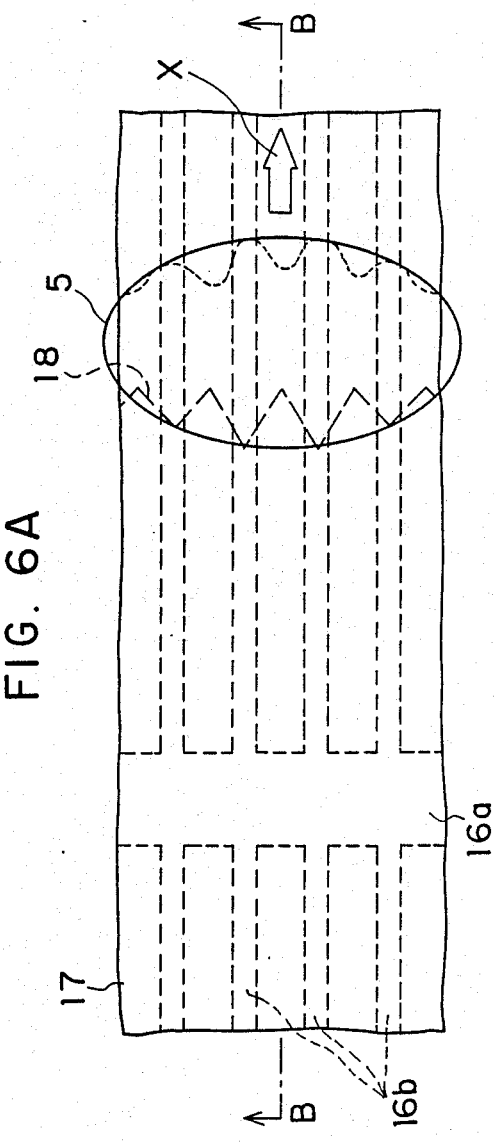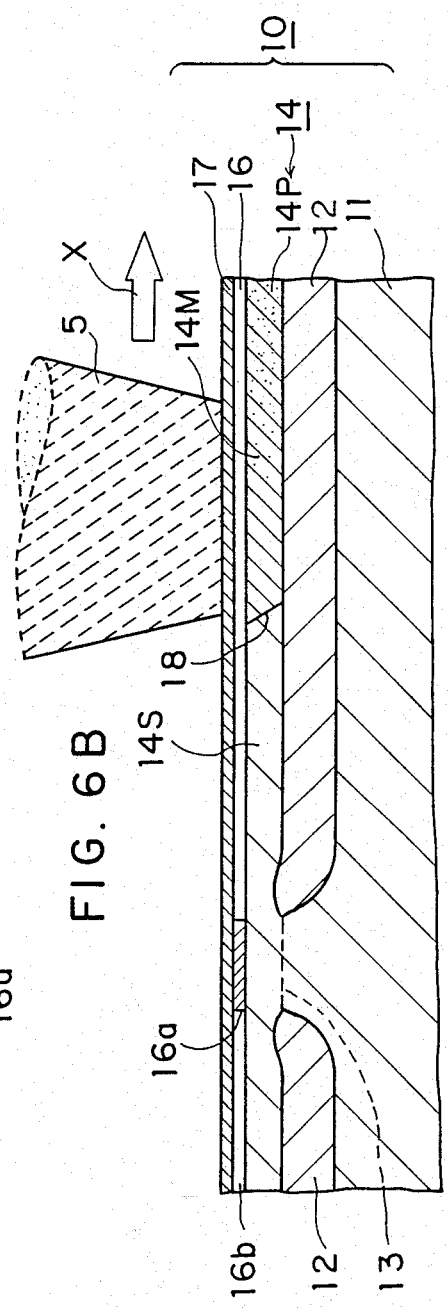
FIG. 6A
FIG. 6B

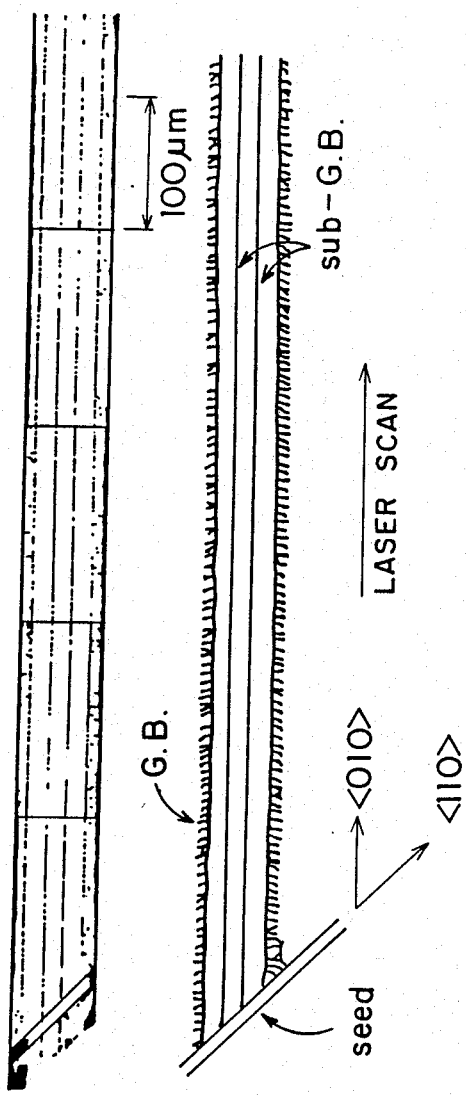

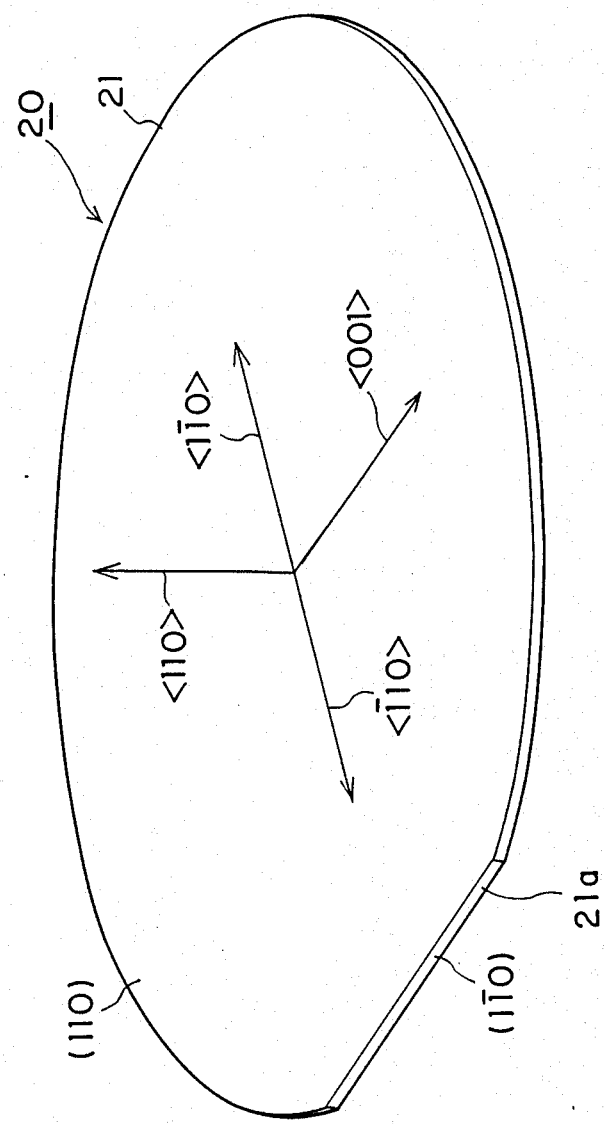

→ <110>

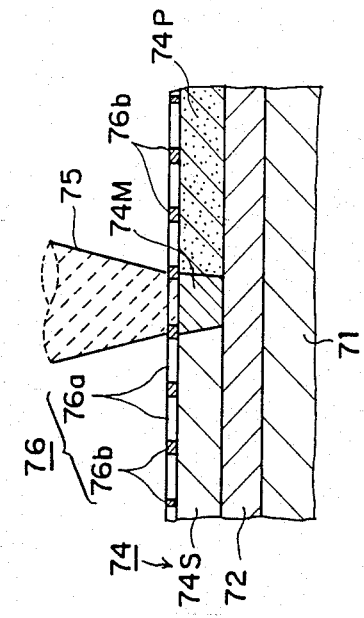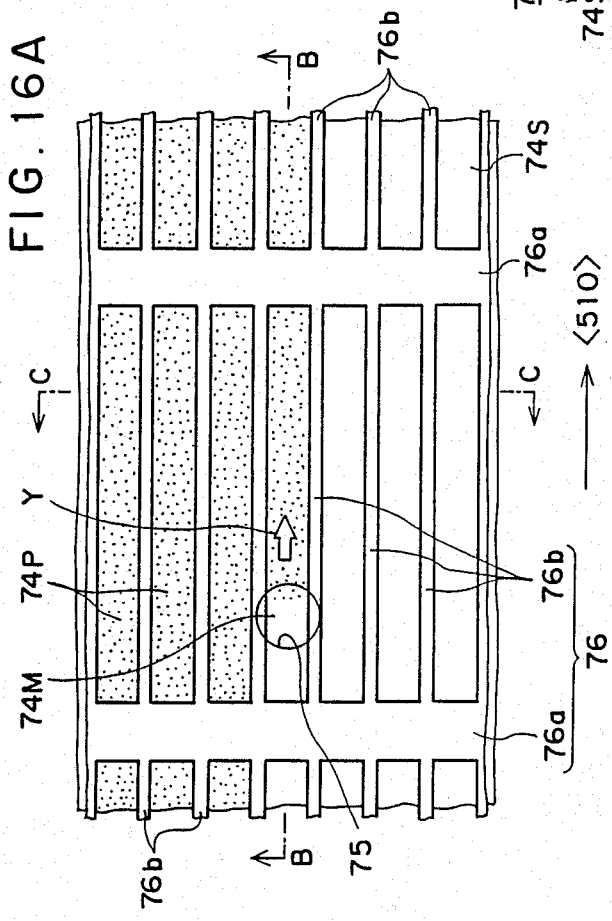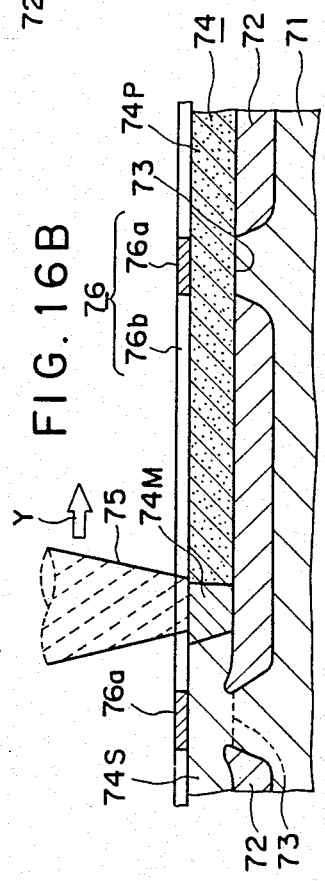

PROCESS FOR PRODUCING SINGLE CRYSTAL SEMICONDUCTOR LAYER AND SEMICONDUCTOR DEVICE PRODUCED BY SAID PROCESS

BACKGROUND OF THE INVENTION

1. Field of the Invention

The present invention relates to a process for producing a single crystal semiconductor layer by recrystallizing a polycrystalline or amorphous semiconductor layer provided on a single crystal semiconductor substrate, with an insulator layer having an opening part provided therebetween, and a semiconductor device such as a diode, a transistor and a thyristor, which comprises a single crystal semiconductor layer produced by the process as a base. In particular, the invention relates to a process by which a polycrystalline or amorphous semiconductor layer can be recrystallized to be a single crystal semiconductor layer with high quality and in a wide range by scanning irradiation with an energy beam controlled in power and temperature distribution while using as a seed a single crystal semiconductor substrate making contact with the semiconductor layer through an opening part, and a semiconductor device comprising a single crystal semiconductor layer with high quality and wide range which is produced by the process.

2. Description of the Prior Art

In recent years, to accomplish increases in the speed and density of semiconductor device, there has been an attempt to produce the so-called three-dimensional semiconductor integrated circuit device in which floating capacitance can be reduced by electrically separating semiconductor circuit elements by dielectric and flat form circuit elements in a three-dimensional manner. In a method, first, a polycrystalline or amorphous semiconductor layer is laminated on the above-mentioned single crystal semiconductor substrate, with an insulator layer having an opening part provided therebetween. Next, the polycrystalline or amorphous semiconductor layer is irradiated with an energy beam to melt, and recrystallize, the polycrystalline or amorphous semiconductor layer. In the recrystallization, since the polycrystalline or amorphous semiconductor layer is in contact with the semiconductor single crystal of the substrate through the opening part, the single crystal serves as a seed for formation of the single crystal semiconductor layer. The single crystal semiconductor layer produced by this method has been provided with the above-mentioned semiconductor circuit elements such as diodes and transistors.

An example of the process for producing the so-called three-dimensional semiconductor device comprising a single crystal semiconductor layer provided with the semiconductor circuit elements mentioned above is "Single Crystal Silicon-on-Oxide by a Scanning CW Laser Induced Lateral Seeding process" presented by H. W. Lam et al in "J. Electrochem. Soc.: SOLID-STATE SCIENCE AND TECHNOLOGY" vol. 128 (September, 1981), pp. 1981-1986. According to the prior art literature, a single crystal is grown from a polycrystalline or amorphous silicon by using a single crystal of substrate silicon as a seed, to thereby contrive recrystallization.

FIG. 1 shows a cross-sectional view of a semiconductor device produced by the above-mentioned lateral seeding process disclosed as prior art. In the figure, on a major surface of a single crystal silicon substrate (hereinafter referred to simply as "substrate") 1 as a single crystal semiconductor substrate is provided an oxide insulator layer (hereinafter referred to simply as "insulator layer") 2 consisting of, for example, silicon dioxide. The insulator layer 2 does not cover the entire part of the major surface of the substrate 1, that is, a portion of the major surface is exposed through opening parts 3. Polycrystalline silicon 4P is laminated as a thin film layer 4 on the entire part on the surface side of the insulator layer 2 and the opening parts 3. Therefore, the polycrystalline silicon 4P is in contact with single crystal silicon 1S of the substrate 1 through the opening parts 3. Next, while irradiating the polycrystalline silicon 4P with a laser beam 5 used as an energy beam, the laser beam 5 is scanned in the direction of arrow X, whereby the polycrystalline silicon 4P is melted to be a molten portion 4M, and when the polycrystalline silicon 4P of the molten portion 4M is resolidified, silicon is recrystallized and grows as single silicon 4S while the single crystal silicon 1S of the substrate 1 making contact therewith through the opening part 3 serves as a seed.

The lateral seeding process has been deemed an ideal crystal growth technique, since the crystal orientation of the single crystal silicon 4S of the thin silicon film layer 4 is perfectly determined by the single crystal silicon 1S of the substrate 1. In addition, a technical idea similar to the above process is disclosed in the patent application entitled "Process for Forming Single Crystal of Semiconductor" which has been applied by Hitachi, Ltd. and published by Japanese Patent Office as Japanese Patent Publication No. 42-12087 (1967) on July 10, 1967.

However, though thought to be excellent in principle, this process has not succeeded in practice. Namely, the crystal growth of a thin silicon film layer 4 using the single crystal silicon 1S of the substrate 1 as a seed proceeded only to about 100 to 200 $\mu$m from the opening part 3, and a multiplicity of crystalline defects such as stacking faults and twins were generated, so that a favorable single crystal layer was not formed. The reason for the ill success of the above-mentioned lateral seeding process lies in that no device has been made to compensate for the laser beam power distribution, which is approximate to the Gaussian distribution, in the scanning irradiation with the laser beam to melt and re-solidify the semiconductor formed of silicon or the like. In FIGS. 2A to 2C in which the same reference symbols as those in FIG. 1 denote the same or corresponding parts, the region irradiated with the laser beam 5 shows a temperature distribution as shown in FIG. 2A, in a direction crossing the beam scanning direction (arrow X). FIG. 2B is a plan view of the condition where the region of the temperature as shown in FIG. 2A has moved on the thin silicon film layer 4, and is presented in comparison with FIG. 2C which is a cross-sectional view corresponding to FIG. 1. In the figure, when the laser beam 5 is moved in the direction of hollow arrow X, a single crystal 4S in the thin silicon film layer 4 grows in the directions of the multiplicity of fine arrows. The directions of the fine arrows extend from low temperature portions at both side edges with respect to the moving direction of the laser beam 5 toward the center axis O of the scanning zone. Since the directions of crystal growth from the side edges meet each other in the manner of conforming substantially to the center axis O, the subsequent growth of the region of single crystal silicon 4S seeded at the opening part 3 and grown to be a single crystal (the hatched area in FIG. 2B) is inhibited. The length over which the region of the single crystal silicon 4S extends is 100 to 200 μm, as mentioned above.

To prevent the crystal growth from proceeding in the directions of the fine arrows from both side edge parts of the scanning zone of the laser beam as mentioned above, an attempt has been made to provide an anti-reflection film or reflective film in a striped form on the face side of the thin film layer 4. An example of this is the anti-reflection film or the like disclosed in "Use of selective annealing for growing very large grain silicon on insulator films" presented by J. P. Colinge et al in "American Institute of Physics/Appl. Phys, Lett. 41(4), 15 August, 1982".

FIGS. 3A to 3C respectively show a partly enlarged plan view of a semiconductor device provided with the above-mentioned anti-reflection film on the surface of a thin silicon film layer, a cross-sectional view taken on line B—B of FIG. 3A and a cross-sectional view taken on line C—C of FIG. 3A, in which the same symbols as those in FIG. 1 and FIGS. 2A to 2C denote the same or corresponding parts. In each of the figures, an anti-reflection zones 6a provided at positions corresponding to an insulator layer 2 of a substrate 1 and stripe portions 6b each provided between the anti-reflection zones 6a in the scanning direction X of a laser beam 5, and is constituted of, for example, a silicon nitride film.

The detailed construction of a semiconductor device 7 comprising the above-mentioned anti-reflection film 6 will now be explained. The substrate 1 consists of single crystal silicon 1S having a {001}plane—a (100) plane or an equivalent crystal plane—as a major surface, and a relatively thick insulator layer 2 constituted of silicon dioxide and having an elongate opening part 3 reaching the major surface of the substrate 1 at least at a part thereof is provided on the major surface of the substrate 1. The opening part 3 is provided in a <110> direction or an equivalent direction (hereinafter referred to simply as "<110> direction") on the major surface of the substrate 1. The thin film layer 4 constituted of polycrystalline silicon 4P is formed by a chemical vapor deposition method (hereinafter referred to as "CVD method"). The striped antireflection film 6 comprises stripe portions 6b the longitudinal direction of which is set in the <110> direction (precisely, the <1$\bar{1}$0> direction), and is built up in a film thickness of 550 Å by the CVD method, in order to control the temperature distribution in the polycrystalline silicon 4P at the time of irradiation with the laser beam 5. The laser beam 5 is scanned in the direction of hollow arrow X in FIGS. 3A and 3B, namely, the <1$\bar{1}$0> direction.

Now, the method of providing a single crystal semiconductor laser through crystal growth on the insulator layer 2 constituted of a relatively thick oxide film will be explained. First, the polycrystalline silicon 4P on the elongate opening part 3 and the relatively thick insulator layer 2 is melted by irradiation with the laser beam to form a molten portion 4M, the melting being caused to reach to the major surface of the substrate 1 at the opening part 3. As a result, the molten part 4M starts epitaxial growth with the single crystal silicon 1S of the substrate 1 as a seed crystal, and the thin silicon layer 4 is recrystallized from polycrystalline silicon 4P into single crystal silicon 4S. Therefore, when the laser beam 5 is scanned in the direction of arrow X—precisely, in the <1$\bar{1}$0> direction on the major surface of the substrate 1—during the irradiation, the molten portion 4M is set into epitaxial growth along the plane orientation of the major surface of the substrate 1, and the single crystal silicon 4S is formed to extend on the insulator layer 2. In this case, the striped antireflection film 6 provided on the thin silicon film layer 4 raises the temperature in the transverse direction with respect to the scanning direction of the laser beam 5. Namely, the temperature of polycrystalline silicon 4P under the region where the anti-reflection film 6 is provided as anti-reflection zones 6a and stripe portions 6b is higher than the temperature of polycrystalline silicon 4P under the region where the anti-reflection zones 6a and the stripe portions 6b are not provided. Accordingly, a periodical temperature distribution in the transverse direction—with respect to the scanning direction—is developed in the region irradiated with the laser beam 5, and in recrystallization of the molten portion 4M, only epitaxial crystal growth takes place with the single crystal silicon 1S at the opening part 3 as a seed crystal. The laser beam 5 is scanned over the entire surface of the thin film layer 4 of the polycrystalline silicon 4P, whereby the single crystal silicon 4S is formed over the entire region of the surface of the semiconductor device 7. Thereafter, the anti-reflection film 6 constituted of a silicon nitride film or the like is removed, resulting in the condition where semiconductor integrated circuit elements such as transistors and diodes can be provided on the single crystal silicon 4S on the surface of the semiconductor device 7.

However, the process for producing a single crystal semiconductor layer using the anti-reflection film mentioned above and the semiconductor device produced by the process has the following various problems.

First, since the laser beam 5 is scanned in direction X orthogonal to the elongate opening part 3 of the insulator layer 2 (precisely, in the <1$\bar{1}$0> direction with respect to the major surface), the liquid-solid interface does not accord with the shape of the (111) plane constituting the crystal growth plane. Therefore, the epitaxial growth is stopped at a distance of about 100 to 200 μm from the opening part 3, after which a crystal having other crystallographic axes would grow. Accordingly, it has been impossible to produce a single crystal semiconductor layer with high quality and wide range.

To solve the above problems, attempts may be made to increase the distance of epitaxial growth of the single crystal on the insulator layer by making the shapes of the liquid-solid interface and the (111) plane accord with each other. As one of such attempts, a method may be contemplated in which the longitudinal direction of the stripe portions of the anti-reflective film constituted of silicon nitride is set to be coincident with or approximate to the <100> direction and the laser beam is scanned during irradiation therewith in a direction parallel to the longitudinal direction of the stripe portions. However, even when the laser beam is scanned in such a direction that the liquid-solid interface accords with the shape of the (111) plane, the crystal state on the left side of the molten portion 4M of the polycrystalline silicon 4P is different from that on the right side—namely, silicon is already in the state of single crystal silicon 4S on one side but it remains as polycrystalline silicon 4P on the other side—, so that the thermal conductivity of silicon varies in the vicinity of the molten portion 4M of the thin film layer 4, resulting in that the shape of the liquid-solid interface becomes irregular. The irregularity of the shape of the liquid-solid interface in the film layer hinders the epitaxial growth of single crystal of the semiconductor layer constituted of silicon or the like. As a counter-measure to this problem, use of a lower scanning speed of the energy beam such as a laser beam to stabilize the liquid-solid interface may be contemplated, but such an approach is unsatisfactory because the crystal growth cannot thereby be improved fundamentally.

Further, in the case of the above-mentioned disaccord of the liquid-solid interface in the thin silicon film layer 4 with the shape of the (111) plane constituting the crystal growth plane, a force such as to make the (111) plane accord with the liquid-solid interface acts in the thin film layer 4. Such an irrational force on or near the crystal growth plane causes crystalline defects such as stacking faults in the semiconductor layer such as the thin silicon layer 4. As a result, as mentioned above, the epitaxial growth of the semiconductor layer would be stopped at a distance of about 100 to 200 μm, and crystals having crystallographic axes different from those of the semiconductor converted into a single crystal would grow, leading to poor quality of the semiconductor device.

A description that the stable crystal growth takes place on (111) plane as mentioned above is found also in "Zone-Melting Recrystallization of Si Film with a Moveable-Strip-Heater Oven" presented by H. W. Geis et al in "J. Electrochem. Soc.: SOLID-STATE SCIENCE AND TECHNOLOGY, December 1982", pp. 2812–2818 (Refer particularly to FIG. 7).

SUMMARY OF THE INVENTION

It is an object of the process for producing a single crystal semiconductor layer and a semiconductor device produced by the process according to the present invention to provide a process by which it is possible to produce a semiconductor layer with high quality over a wide range, and to obtain a semiconductor device provided with a high-quality large-area single crystal semiconductor layer.

It is another object of the invention to provide a process by which a single crystal semiconductor layer can be produced without generating stress in the crystal growth plane even at an enhanced scanning speed of a laser beam, and a semiconductor device produced by the process.

It is a further object of the invention to provide a process for producing a semiconductor layer by which a polycrystalline or amorphous semiconductor can be recrystallized through single crystal growth over a distance as long as possible by scanning irradiation with an energy beam while using a single crystal semiconductor of a semiconductor substrate as a seed through an opening part of an insulator layer, and a semiconductive device produced by the process.

It is still another object of the invention to provide a process for producing a single crystal semiconductor layer by which it is possible to make a liquid-solid interface in the vicinity of a molten portion of a semiconductor accord with a crystal growth plane, and a semiconductor device produced by the process.

To attain the above objects, the process for producing a single crystal semiconductor layer according to the present invention comprises laminating an oxide insulator layer having a seeding opening part, preferably in a <110> direction or an equivalent direction, on a single crystal semiconductor substrate, building up a polycrystalline or amorphous thin semiconductor film layer on the entire part of the surface of the insulator layer inclusive of the opening part, providing a striped anti-reflection film or reflective film on the surface of the thin film layer so that the longitudinal direction of the stripes is at a predetermined angle, preferably in the range of 25° to 55°, to the <110> direction or the equivalent direction, and irradiating the thin film layer with an energy beam while scanning the energy beam in a direction different from the longitudinal direction of the stripes of the anti-reflection film or reflective film, preferably in the <110> direction or the equivalent direction, whereby the polycrystalline or amorphous semiconductor of the thin film layer is partially melted and the liquid-solid interface of the semiconductor re-solidified under the scanning is moved while conforming with at least one {111} plane. Accordingly, the thus produced semiconductor device comprises a single crystal semiconductor substrate having a {100} plane as a major surface, an oxide insulator layer laminated on the major surface of the substrate and having a seeding opening part in a <110> direction or an equivalent direction, and a single crystal semiconductor layer provided by melting and re-solidifying a polycrystalline or amorphous semiconductor through irradiation with an energy beam through an anti-reflection film or reflective film having stripes in a direction at an angle of 25° to 55° to the <110> direction or the equivalent direction on the insulator layer while scanning the energy beam in the <110> direction or the equivalent direction.

BRIEF DESCRIPTION OF THE DRAWINGS

FIG. 2A is a characteristic diagram showing the power distribution in a direction orthogonal to the scanning direction of a laser beam as an energy beam; FIG. 2B is a plan view showing the melted and re-solidified states of a polycrystalline silicon as a polycrystalline or amorphous semiconductor layer, and FIG. 2C is a cross-sectional view taken on the scanning center axis O of FIG. 2B and placed in correspondence with FIG. 2B;

FIGS. 3A to 3C respectively show a plan view, a cross-sectional view taken on line B—B thereof and a cross-sectional view taken on line C—C thereof, of a semiconductor device produced by a prior art process for producing a single crystal semiconductor in which a laser beam as an energy beam is scanned through a striped silicon nitride film provided as an anti-reflection film;

FIGS. 5A and 5B show an enlarged plan view and a cross-sectional view taken on line B—B thereof, respectively, of the a single crystal silicon substrate shown in FIG. 4;

FIGS. 6A and 6B are a plan view and a crosssectional view taken on line B—B thereof, respectively, showing the condition where the single crystal silicon substrate of the first embodiment is irradiated with a laser beam which is scanned;

FIG. 8 is an enlarged view of crystal faced which shows the details of the single crystal silicon obtained by the process of the first embodiment;

FIG. 9 shows a perspective view of a single crystal silicon substrate used in a second embodiment of the present invention;

FIGS. 16A to 16C, which are presented for illustrating a seventh embodiment of the present invention, are respectively a plan view, a cross-sectional view taken on line B—B thereof and a cross-sectional view taken on line C—C thereof, showing a semiconductor device produced by the embodiment and the production process.

DETAILED DESCRIPTION OF THE PREFERRED EMBODIMENT

Preferred embodiments of the process for producing a single crystal semiconductor layer and a semiconductor device produced by the process according to the present invention will now be explained in detail below while referring to the accompanying drawings.

Figure 1:
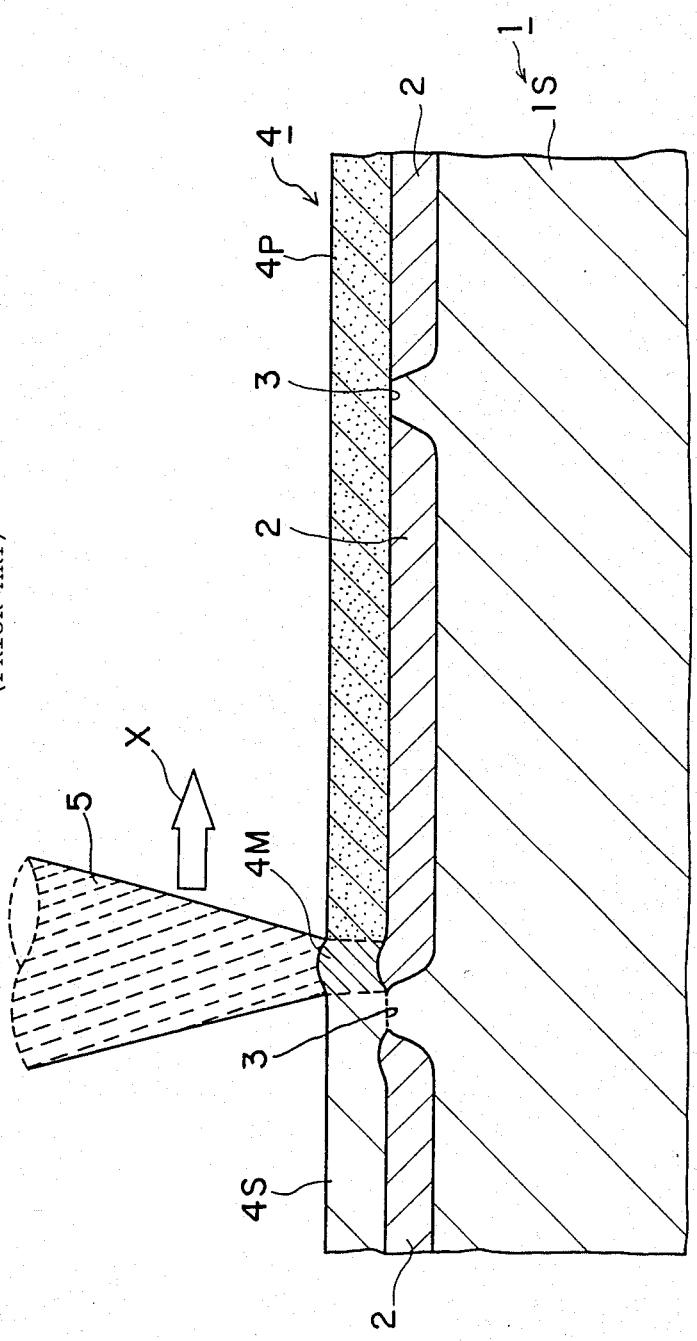
FIG. 1 shows a partly enlarged cross-sectional view of a semiconductor device produced by a prior art process for producing a single crystal semiconductor layer.
Figure 4:
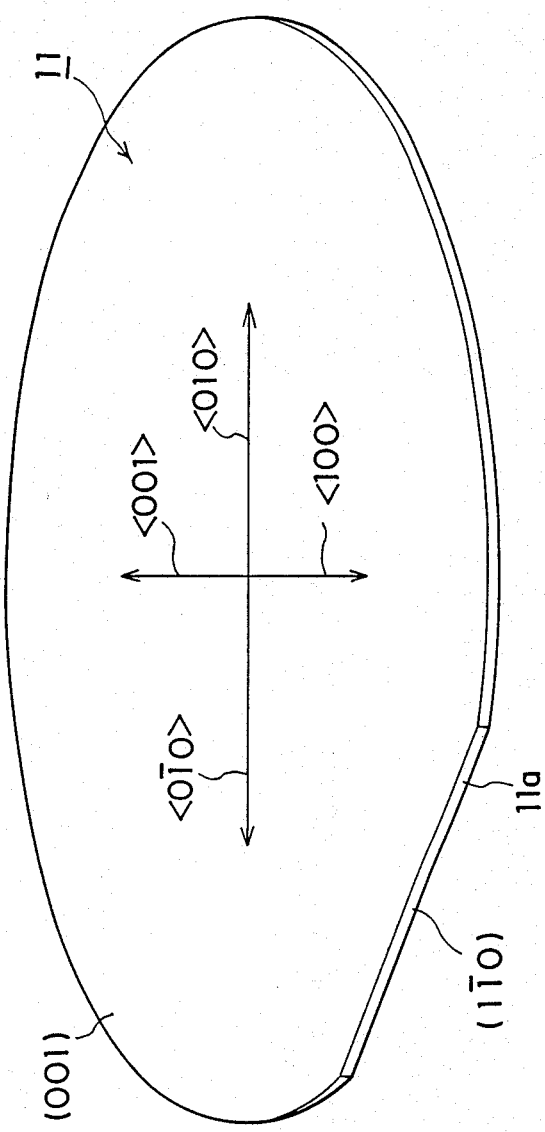
FIG. 4, presented for illustrating a first embodiment of the present invention, shows a perspective view of a single crystal silicon substrate used as a semiconductor substrate.

FIGS. 4 to 8 illustrate a first embodiment of the present invention. FIG. 4 shows a single crystal silicon substrate (hereinafter referred to as "substrate") 11 as a single crystal semiconductor used in the first embodiment. A major surface of the substrate 11 is a (001) plane, while an orientation flat surface 11a serving as a reference for forming a semiconductor circuit element or the like is a ($1\bar{1}0$) plane.

Referring to FIG. 5A and FIG. 5B, there is schematically illustrated a wafer 10 for growing a semiconductor single crystal layer using the substrate 11 shown in FIG. 4. FIG. 5A is a plan view showing a part of the wafer 10, and FIG. 5B shows a cross-sectional structure along line B—B of FIG. 5A. On the single crystal silicon substrate 11 is provided an insulator layer 12 having a seeding opening part 13 of about 10 μm in width, and a thin film 14 of polycrystalline silicon to be converted into a single crystal is provided on the insulator layer 12. On the silicon layer 14 is provided an anti-reflection film 16 patterned in the same manner as in FIG. 3A. In the present embodiment, however, the stripe portions 16b disposed along the scanning direction of the laser beam are made to accord with the crystal direction, <100> direction, of the substrate 11. Further, on the surface of the wafer 10 is provided a thin insulator layer 17 for protection of the surface.

FIGS. 6A and 6B illustrate schematically the condition where the wafer 10 is scanned with a laser beam 15 from the left to the right (in the direction of arrow X). In the scanning of the laser beam 5, for instance, an about 15-W argon laser capable of continuous oscillation can be used, and a beam with a spot size of about 100 μm can be scanned at a velocity of about 12 cm/sec. Of the silicon layer 14 being irradiated with the laser beam 5, the region beneath the antireflection stripe portion 16b absorbs the laser energy well, so that the temperature of the region becomes higher than the temperature of other regions. As a result, a periodic temperature distribution corresponding to the period of the stripe portions 16b is developed in a direction crossing the scanning direction of the laser beam 5. Therefore, at the liquid-solid interface 18 of a molten portion 14M formed at the front of single crystal growth in the silicon layer 14, re-solidification is retarded in the region beneath the stripe portion 16b, while the solidification proceeds in the other regions, resulting in that the liquid-solid interface of the crystal growth is sawtooth-shaped as indicated by reference numeral 18 in FIG. 6A. In addition, heat in the silicon layer 14 is released in the direction of the opening part 13 and in the downward direction, so that the liquid-solid interface 18 is advanced on the lower side in the silicon layer 14 and is retarded on the upper side in the silicon layer 14, as shown in FIG. 6B.

Figure 7:
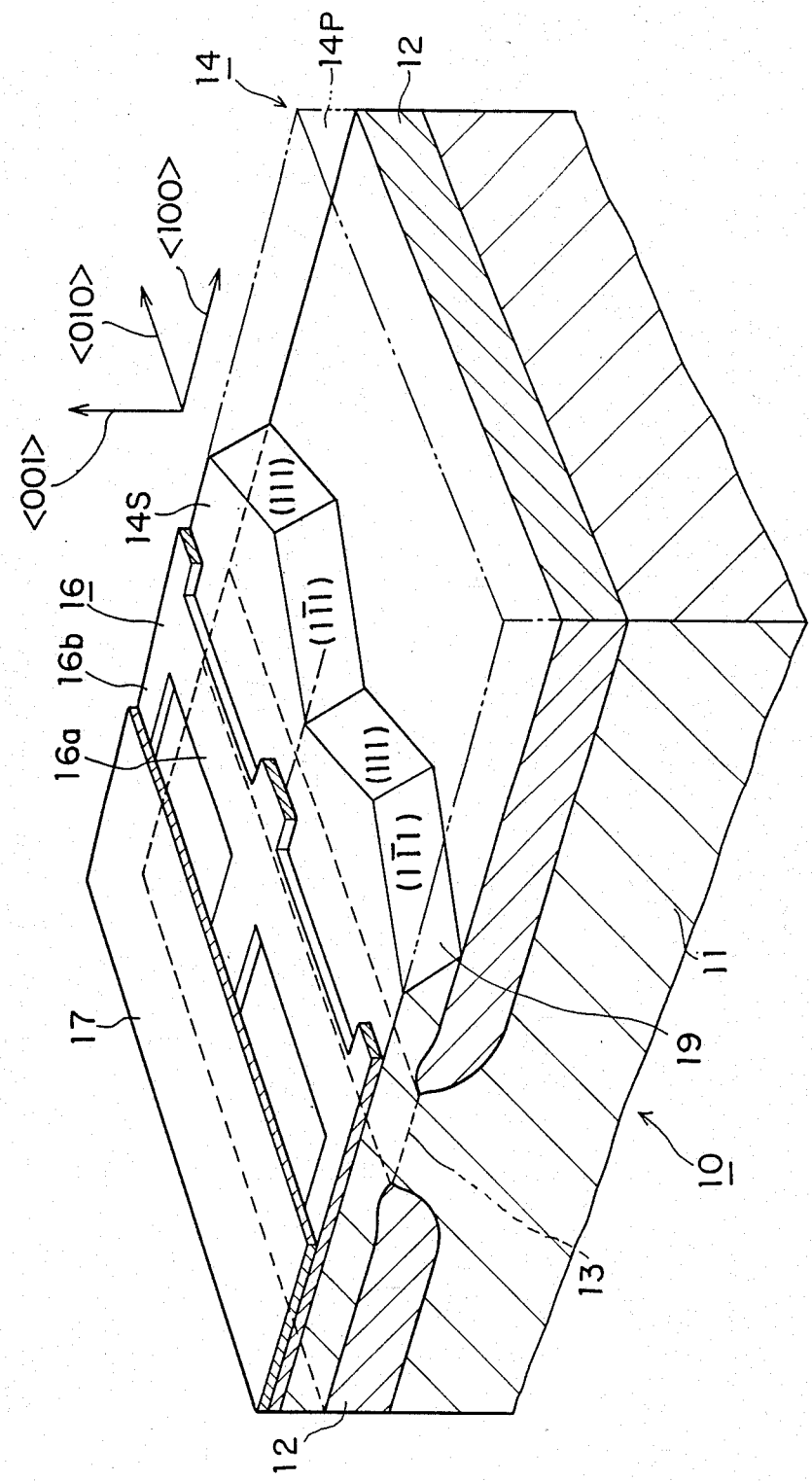
FIG. 7 is a perspective view showing the condition where crystal faces grow through a combination of {111} planes in the substrate of the first embodiment.

In the perspective view of a part of the wafer 10 shown in FIG. 7, by a combination of {$1\bar{1}1$} planes in the single crystal region of the silicon layer 14 tending to grow in <100> direction on the insulator layer 12 by succeeding to the crystal orientation of the substrate 11, a sawtooth-shaped boundary face as indicated by reference numeral 19 can be formed. Namely, the ($1\bar{1}1$) plane and (111) plane have respective intersections with the insulator layer 12 which intersect with each other at 90°, and a tooth-shaped boundary face 19 similar to the liquid-solid interface 18 shown in FIG. 6A can be formed. In addition, the boundary face 19 is advanced in the <100> direction on the lower side in the silicon layer 14 and is retarded on the upper side, as in the case of the liquid-solid interface 18 in FIG. 6B.

Accordingly, by appropriately setting the width of the opening part 13, the thickness of the anti-reflection film and the width and interval of the stripe portions 16b, it is possible to make the liquid-solid interface 18 of crystal growth accord with the boundary 19 consisting of a combination of (111) plane and (111) plane. In this case, the single crystal 14S grows accompanied by movement of {111} planes which are the most stable crystal faces of silicon, and, accordingly, stress such as to generate grain boundaries or crystallographic faults is extremely small, and a stable single crystal growth can be achieved.

FIG. 8 shows at its upper part an optical microphotograph of a single crystal growth zone of the silicon layer 14 thus obtained, and illustrates at its lower part the structure of the zone. The single crystal growth zone is obtained by using an opening part 11 of 9 μm in width, an anti-reflection film 16 constituted of a silicon nitride film of 500 nm in thickness and a surface protective film 17 constituted of a silicon nitride film of 60 Å in thickness. In the photograph of the SOI film after Secco etched to delineate crystalline defects as shown in FIG. 8, no crystallographic faults other than subgrain boundaries (sub-G. B.) parallel to the single crystal zone are observed and the crystal has grown over a length of not less than 1 mm from the opening part (seed), as illustrated in the lower diagram.

FIG. 9 shows a silicon single crystal substrate 21 which can be used in a second embodiment. A major surface of the substrate 21 is a (110) plane, and the orientation flat surface 21a thereof is a ($1\bar{1}0$) plane.

Figure 10A:
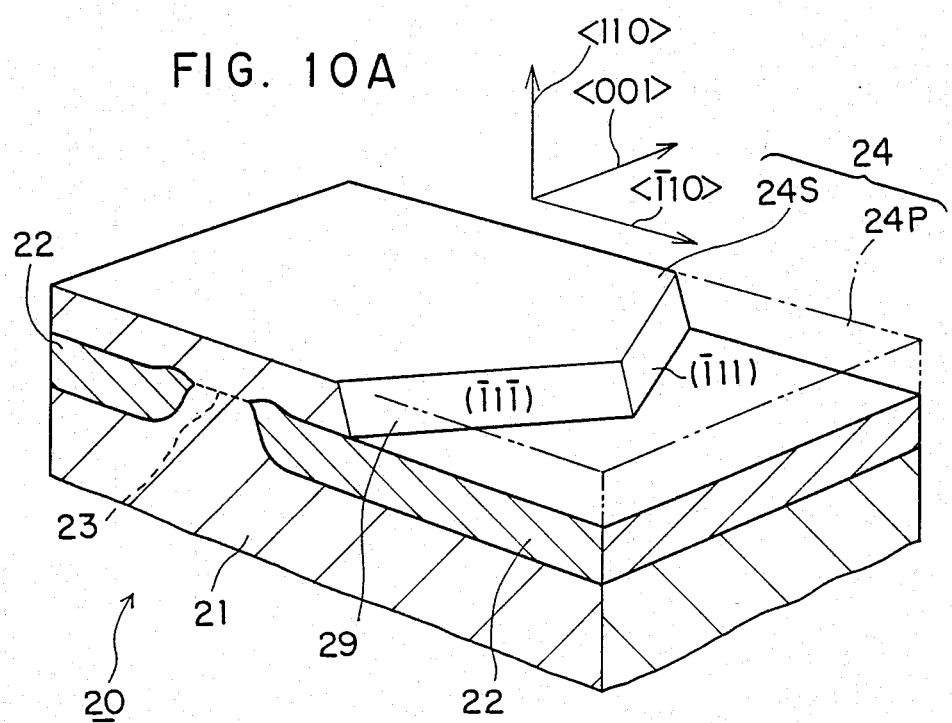
FIGS. 10A and 10B are each a perspective view showing a boundary plane consisting of a combination of {111} planes of a single crystal grown on the substrate shown in FIG. 9.
Figure 10B:
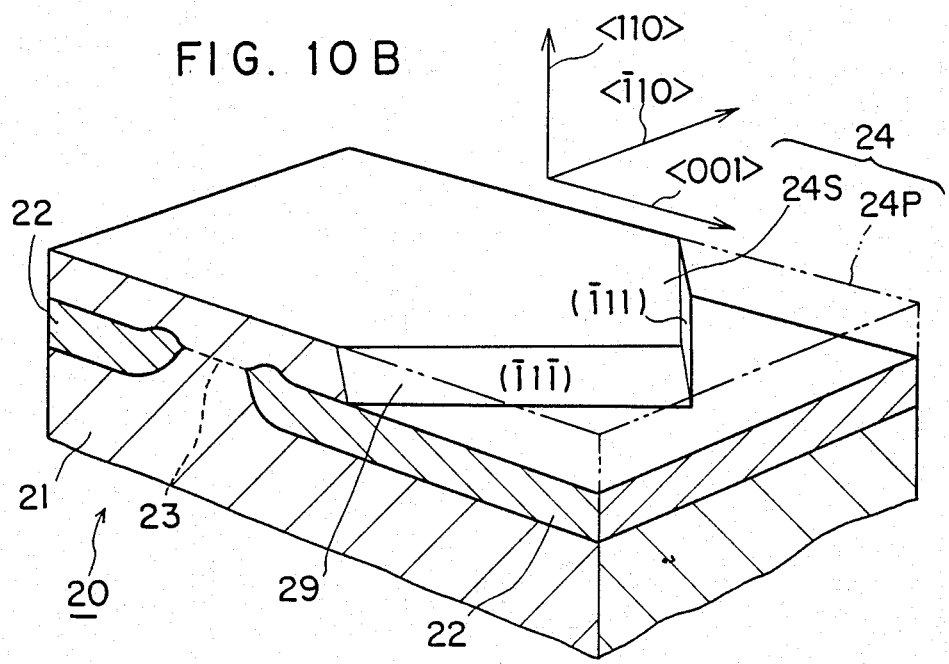

FIGS. 10A and 10B are perspective views, similar to FIG. 7, in the case of converting a silicon layer 24 into a single crystal by using the silicon single crystal substrate 21 shown in FIG. 9. FIG. 10A corresponds to the case of growing a single crystal 24A in $<1\bar{1}0>$ directions, while FIG. 10B corresponds to the case of growing the single crystal in $<001>$ directions. In FIGS. 10A and 10B, the ($\bar{1}1\bar{1}$) plane and the ($\bar{1}11$) plane intersect with each other at a solid angle of 109.47° and at a solid angle of 70.52°, respectively, and both planes are erected vertical in the silicon layer 24. Therefore, the boundary face 29 consisting of such a combination of {111} planes can be made to accord with the liquid-solid interface of crystal growth by setting the width of the opening part 23 of the insulator layer 22 to be as small as about 2 μm, and setting the width and interval of the stripe portions to be, for example, respectively 4 μm and 10 μm in the case of FIG. 10A, and respectively 6 μm and 10 μm in the case of FIG. 10B. With such arrangement, the difference in heat release between the upper side and the lower side in the silicon layer 24 is reduced, and the liquid-solid interface can be made to accord with the boundary face 29 consisting of the combination of {111} planes, in each of the cases of FIG. 10A and FIG. 10B. Thus, the silicon layer 24 is favorably converted into a single crystal, in the same manner as in the case of using a single crystal substrate 11 having a (001) plane as a major surface. It goes without saying that the major surface of the single crystal layer 24S in the present cast is a (110) plane, whereas that in the case of using the substrate of FIG. 4 is a (001) plane.

Although the above embodiments have been explained by assigning specified facial and axial orientations, it is clear that the present invention can be carried out in the same manner by using an equivalent combination of facial and axial orientations in an equivalent relationship.

In addition, although the above embodiments have been explained referring to the case of using a laser beam, the same results can be obtained also by using, for example, a linear electron beam.

Figure 11A:
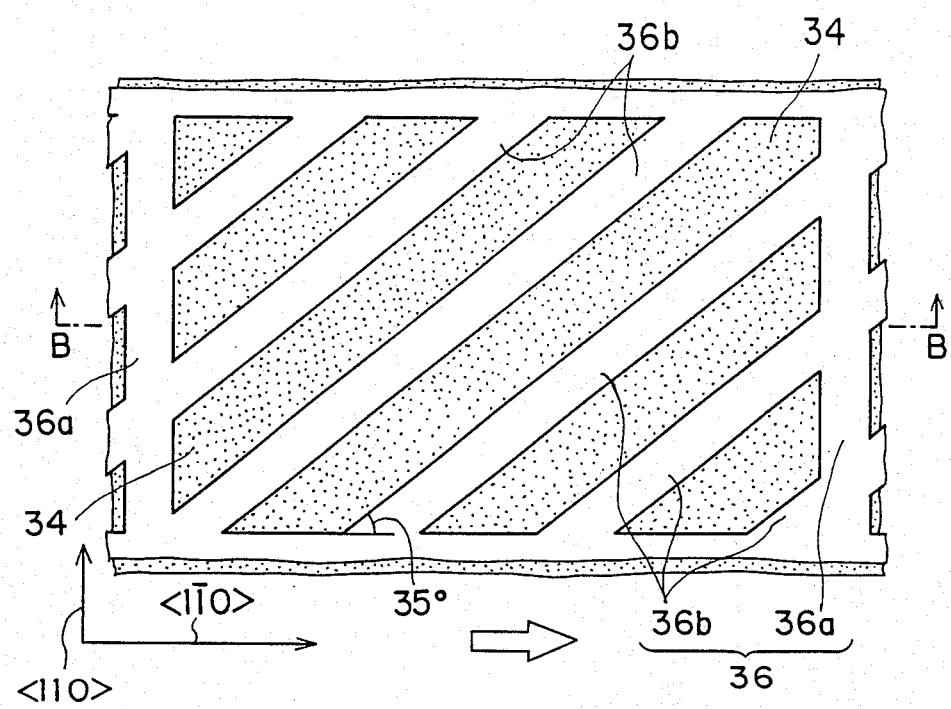
FIGS. 11A and 11B, presented for illustrating a third embodiment of the present invention, show a plan view and a cross-sectional view taken on line B—B thereof, respectively, of a semiconductor device produced by this embodiment.
Figure 11B:
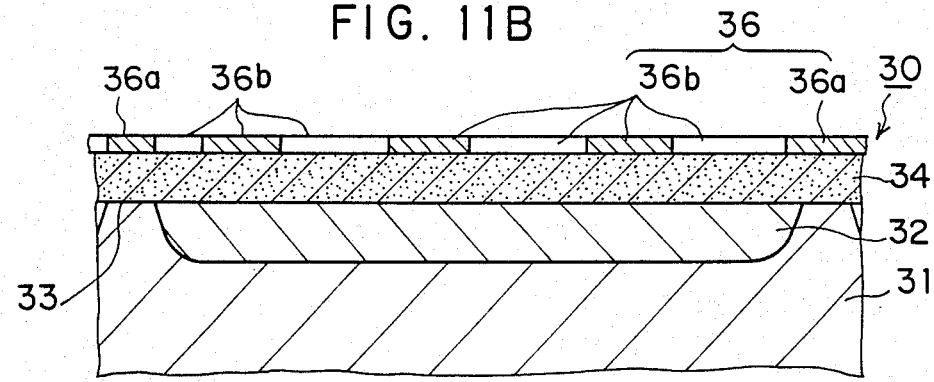

Now, a third embodiment of the present invention will be explained referring to FIGS. 11A to 12B. In FIGS. 11A and 11B, as a characteristic feature of the present invention, a silicon nitride film 36 as an anti-reflection film is patterned in a striped form with a film thickness of 550 Å and in a direction at an angle of 35° to the $<110>$ direction. The width of the stripe portions 36b is, for example, about 4 μm and the interval is about 10 μm. In addition, elongate opening parts 33 are provided in $<110>$ and $<1\bar{1}0>$ directions so as to surround an insulator layer 32 constituted of a silicon oxide film, in order to determine chip regions on a semiconductor wafer 30 and to ensure that the scanning direction of laser light is not limited to one direction but can be in the opposite direction. The length of the elongate opening part 33 is set to be not less than 1 mm in both directions. As to the other points, the construction is the same as a conventional one. A laser beam, for instance, an argon laser beam controlled to have a beam diameter of 100 μm is used to irradiation while scanning the beam at a velocity of 25 cm/sec substantially in a $<110>$ direction indicated by a hollow arrow in the figure. After the first scan is over, the laser beam is shifted 40 μm in a direction perpendicular to the scanning direction, and irradiation with the laser beam is conducted while scanning the beam at a velocity of 25 cm/sec in the $<110>$ direction, in the same manner as in the preceding scan.

Figure 12A:
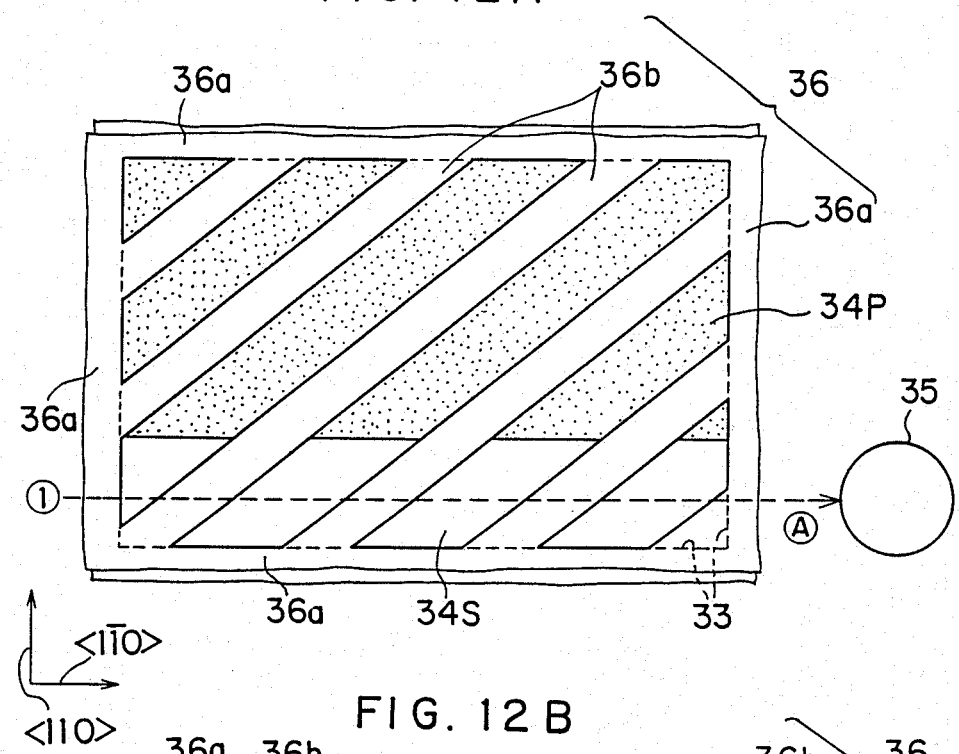
FIGS. 12A and 12B are plan views showing the state upon the first scanning and the state upon the second scanning, respectively, in the irradiation with an energy beam in the third embodiment.
Figure 12B:
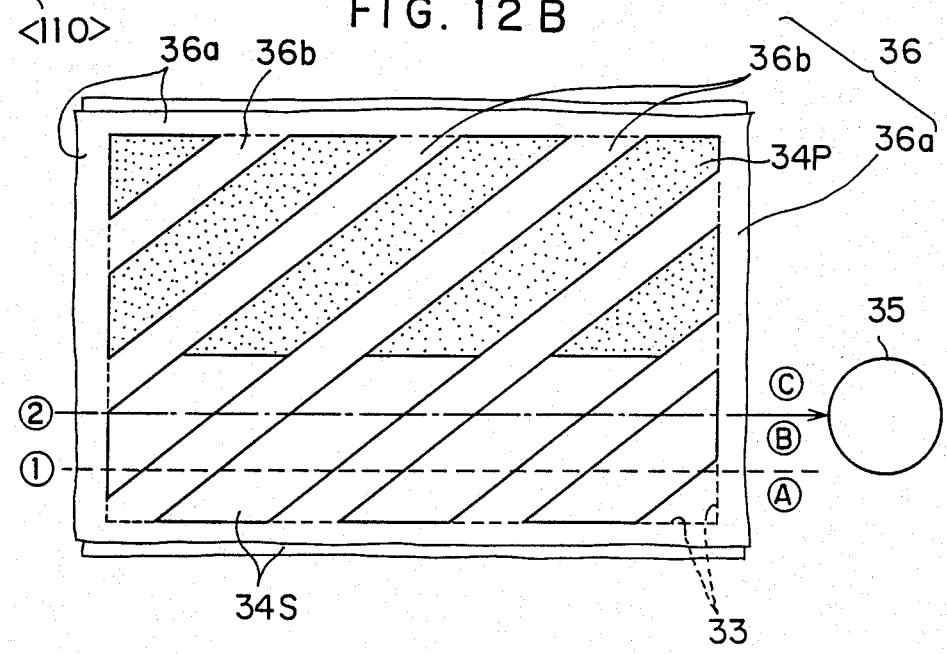

FIGS. 12A and 12B are plan views showing the process for producing a semiconductor single crystal film 34S by using the substrate 31 shown in FIGS. 11A and 11B. The mechanism of converting a polycrystalline silicon film into a single crystal will detailed below while referring to FIGS. 12A and 12B.

A laser beam 35 of 100 μm in beam diameter supplied from, for example, an argon laser is scanned so that the center of the beam 35 is along a broken line ① in the direction of the broken-line arrow. Since the laser beam 35 generally has the so-called Gaussian distribution of temperature in which temperature is higher at a central part and lower at peripheral parts, the polycrystalline film 34P melted starts to be solidified and recrystallized starting from the peripheral part of the beam where the temperature is lower. On the other hand, since a silicon nitride film 36 as an anti-reflection film is patterned in the shape of stripes 36b on the polycrystalline silicon film 36, the temperature of the polycrystalline silicon film 34P beneath the silicon nitride film 36 is maintained to be higher than that in the regions where the silicon nitride film 36 is not provided. As a result, under both the effect of the temperature distribution of the laser beam 35 and the effect of the silicon nitride film 36 provided as the anti-reflection film, the solidification and recrystallization of the molten polycrystalline silicon 34P proceed in the direction of the arrow, in other words, from the center of the lower-temperature region where the silicon nitride film 36 is not provided toward the higher-temperature region where the silicon nitride film 36 is provided, and from the periphery of the laser beam 35 toward the center of the beam 35. In this case, since the elongate opening part 33 is provided in the region corresponding to an end part of the laser beam 35 in the right-hand region as viewed in the scanning direction of the laser beam 35 (region Ⓐ in FIG. 12A), epixtaxial crystal growth with the single crystal silicon substrate 31 as a seed crystal takes place through the opening part 33. The epixtaxial growth proceeds continuously toward the region of the polycrystalline silicon film 34P where the silicon nitride film 36 is absent, and the polycrystalline silicon film 34P in region Ⓐ grows entirely into a single crystal 34S having a (001) facial orientation. In this case, since the silicon nitride film 36 as the anti-reflection film is disposed in a direction at 35° to the $<110>$ direction, namely, in $<510>$ direction and the laser beam 35 is scanned in the $<1\bar{1}0>$ direction, the liquid-solid interface is parallel to the $<1\bar{1}0>$ direction and accords with the intersection line of (111) plane and (001) plane. Further, the crystal state is unvaried on the left side and the right side with respect to the direction of crystal growth. Accordingly, a single crystal 34S of high quality containing few crystalline defects such as stacking faults can be obtained.

On the other hand, in the left-hand region as viewed in the scanning direction of the laser beam 35 (region Ⓑ in FIG. 12B), the solidification and recrystallization of a polycrystalline silicon film 34 is accompanied by crystallization with a seed constituted of the adjacent polycrystalline silicon film 34P in the region not yet scanned with the laser beam 35 (the upper side in FIG. 12A), so that an aggregate of crystals having various crystal faces is formed, and a grain boundary parallel to the broken line ① is formed at the boundary of region Ⓐ and region Ⓑ (namely, the broken line ①).

Now, FIG. 12B will be explained. After the first scan of the laser beam 35 is over, the center of the laser beam 35 is again shifted upward on the figure by about 40 μm in a direction perpendicular to the scanning direction (to position ②). Then, scanning irradiation with the laser beam 35 is again conducted. In this case, the melting of the polycrystalline silicon film 34P by the scanning of the laser beam 35 along the one-dotted line ② in the figure reaches to region Ⓐ. By the second scan of the laser beam 35, region Ⓑ and region Ⓒ in the figure are melted and recrystallized. Since region Ⓐ has been entirely converted into a single crystal 34S by the preceding scan of the laser beam 35 and the melting region in the second scan of the laser beam 35 (the scan along one-dotted line ② in the figure) reaches to region Ⓐ, the polycrystalline silicon film 34P in region Ⓑ is brought into single crystal epitaxial growth with the single crystal 34S in region Ⓐ as a seen crystal. On the other hand, the polycrystalline silicon 34P in region Ⓒ is crystallized with the polycrystalline silicon film 34P on the upper side in FIG. 12B as a seed, so that an aggregate of crystals having various crystal faces is formed, and, again, a grain boundary is generated at the boundary of region Ⓑ and region Ⓒ (the one-dotted line ② in the figure). The overlap scanning, namely, such scanning that the scanning regions overlap appropriately with each other is repeated, whereby the polycrystalline silicon film 34P on a silicon oxide film 32 is entirely grown into a single crystal having the same face, (001) plane, as that of the single crystal silicon substrate 31. In this case, the distance over which the polycrystalline silicon film 34P is converted into a single crystal by one scan of the laser beam 35 is limited to half the beam diameter of the laser beam 35, i.e., 50 μm in the <110> direction (the vertical direction in the figure) and about 60 μm in a direction parallel to the longitudinal direction of the stripe portions 36b of the silicon nitride film 36 serving as the anti-reflection film; therefore, there occurs no accumulation of strains generated due to difference in coefficient of thermal expansion between the polycrystalline silicon film 34P and the substrative silicon oxide film 32 at the interface thereof, so that single crystal growth is not hindered. Accordingly, since the direction of the single crystal growth is substantially parallel to the longitudinal direction of the stripe portions 36b and the distance of crystal growth effected by one scan of the laser beam is limited to a short distance, it is possible to prevent the growth of single crystal from being hindered by stress generated at the boundary between the polycrystalline silicon film 34P and the silicon oxide film 32, and it is therefore possible to obtain a high-quality large-area semiconductor single crystal layer in a short time.

Figure 13A:
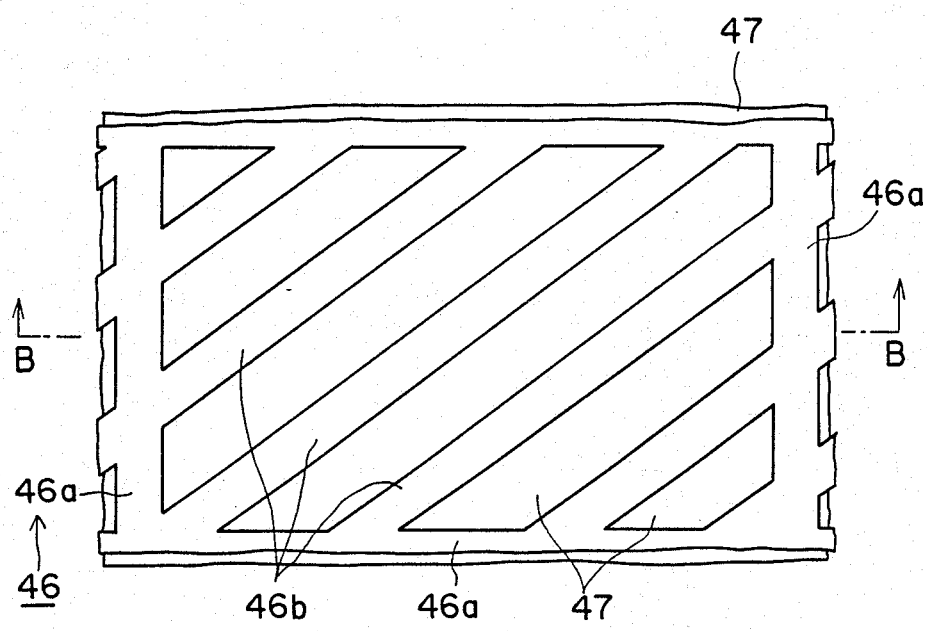
FIGS. 13A and 13B show a plan view and a cross-sectional view taken on line B—B thereof, respectively, of a semiconductor device produced by a fourth embodiment of the present invention.
Figure 13B:
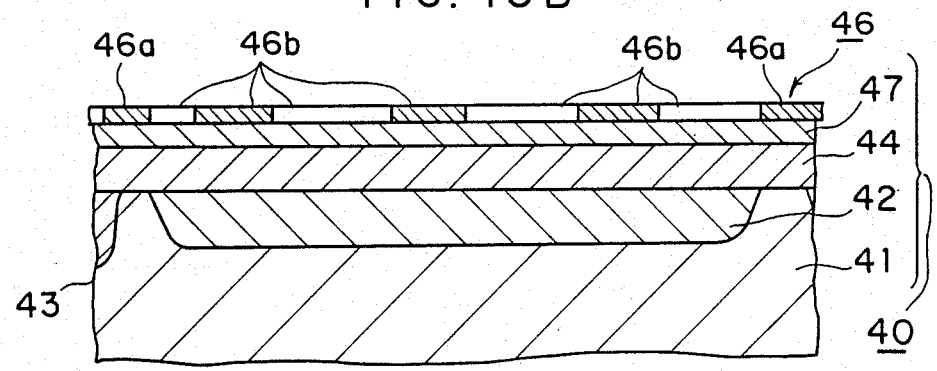

Although the silicon nitride film 36 (550 Å thick) has been used as an anti-reflection film in the above embodiment, any film constitution that has the function of the anti-reflection film, namely, that provides the desired temperature distribution in the polycrystalline silicon film at the time of irradiation with a laser beam, may be used. For example, the same efefct can be obtained in a fourth embodiment shown in FIGS. 13A and 13B, by use of an insulator anti-reflection film of two-layer construction in which a silicon oxide film 47 of 1600 Å in thickness is built up on a polycrystalline silicon film 44 by the CVD method and a silicon nitride film 46 of 550 Å in thickness is provided on the silicon oxide film 47 in the pattern of stripes 46b.

Figure 14A:
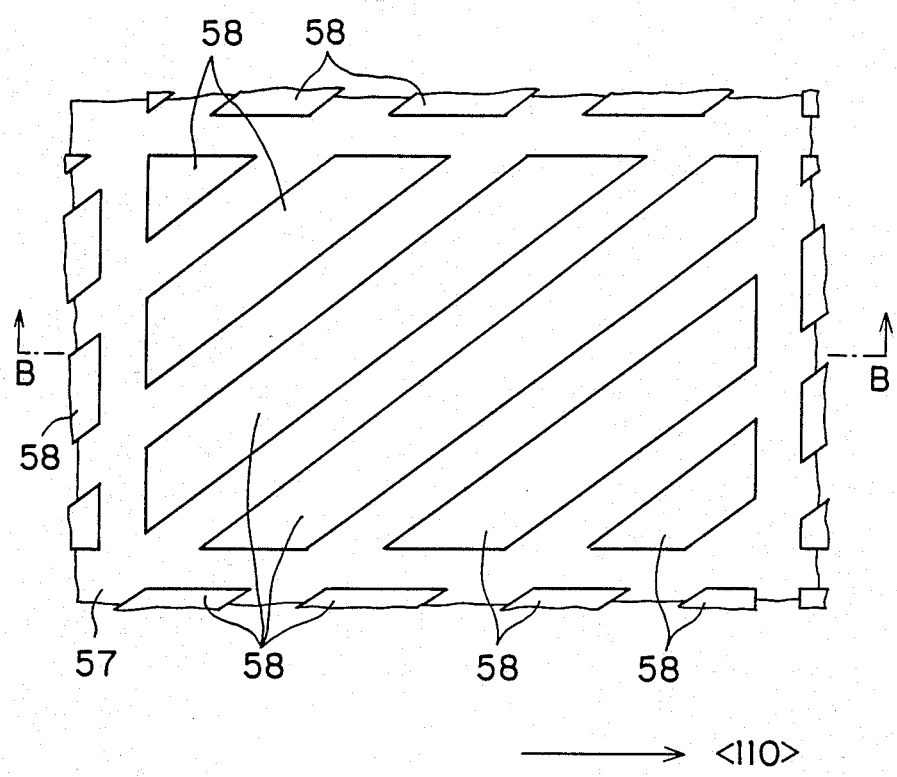
FIGS. 14A and 14B show a plan view and a cross-sectional view taken on line B—B thereof, respectively, of a semiconductor device produced by a fifth embodiment of the present invention.
Figure 14B:
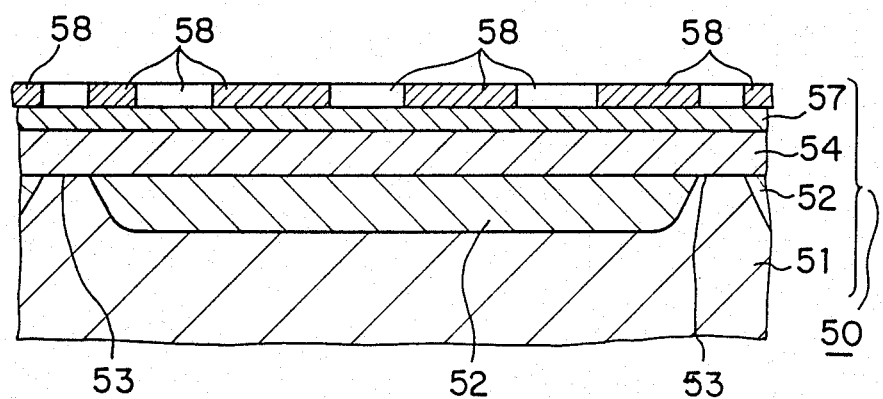

Further, as in a fifth embodiment shown in FIGS. 14A and 14B, a film constitution may be employed in which a silicon oxide film 57 is built up on a polycrystalline silicon film 54 by the CVD method in a film thickness of 2000 Å and a striped polycrystalline silicon film 58 is provided on the silicon oxide film 57. In this case, since the striped polycrystalline silicon film 58 absorbs the energy of the laser beam, the temperature of the polycrystalline silicon 54 lying under the region where the stripe of the polycrystalline silicon is provided is lower than the temperature of the polycrystalline silicon film 54 under the region where the polycrystalline silicon stripe 58 is not provided.

Figure 15A:
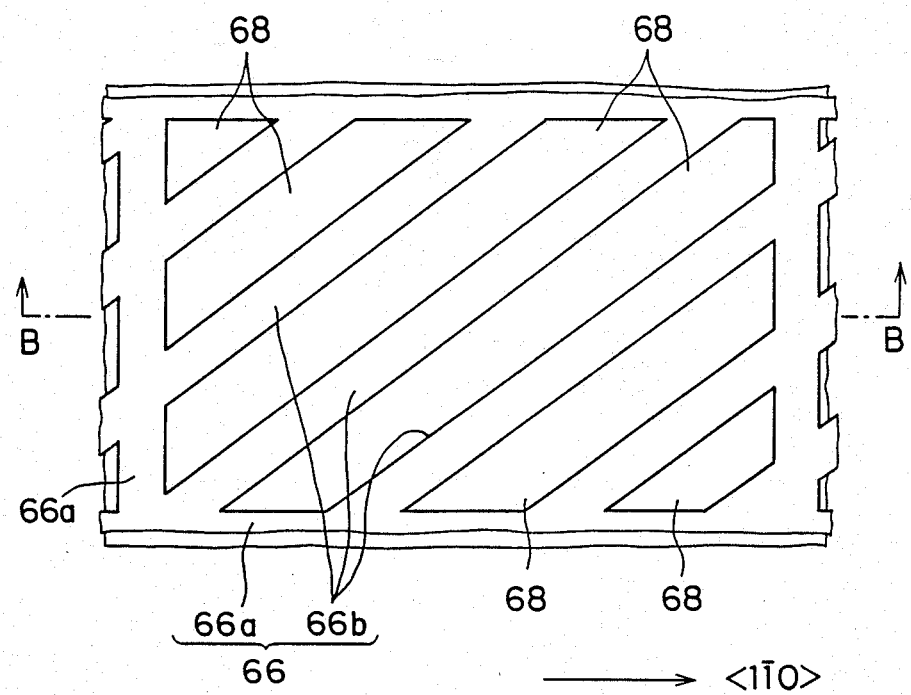
FIGS. 15A and 15B show a plan view and a cross-sectional view taken on line B—B thereof, respectively, of a semiconductor device produced by a sixth embodiment of the present invention.
Figure 15B:
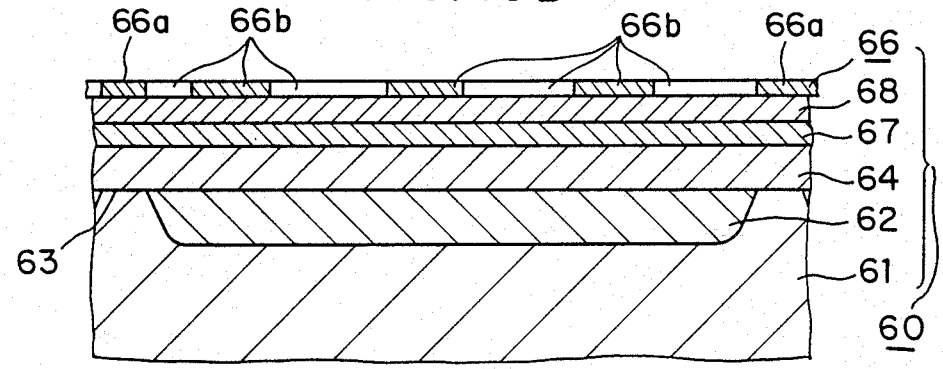

Moreover, as in a sixth embodiment shown in FIGS. 15A and 15B, a film constrituion may be used in which a silicon oxide film 67 of 2000 Å in thickness is provided on a first polycrystalline silicon film 64 by the CVD method, then a second polycrystalline silicon film 68 of 4000 Å in thickness and a silicon nitride film 66 of 550 Å in thickness are sequentially provided on the silicon oxide film 67 by the CVD method, and the silicon nitride film 66 is patterned in the shape of stripers 66b. In this case, the second polycrystalline silicon film 68 absorbs the heat of the laser beam to melt, and the hat arising from the fusion of the second polycrystalline silicon film 68 melts indirectly the first polycrystalline silicon film 64.

The same effect as above can also be obtained by providing a reflective film of a high melting metal in a striped form, which produces the same temperature distribution as above in the polycrystalline silicon film to be melted.

In addition, the direction of the elongate opening part 63 provided in the silicon oxide film 62 serving as an insulator film may not be parallel to the <110> direction, and it is not necessary to provide the opening parts 63 in both <110> direction and <1$\bar{1}$0> direction so as to surround the polycrystalline or amorphous semiconductor to be melted. Namely, the same effect as above can be obtained where the opening part is so provided that epitaxial growth with the semiconductor single crystal substrate as a seed crystal takes place when the polycrystalline or amorphous silicon film is solidified and recrystallized upon the first scan of the laser beam.

Further, it is not necessary that the longitudinal direction of the stripes of the anti-reflection film or reflective film be at 35° to the <110> direction or an equivalent direction: the same effect as above can also be obtained by setting the longitudinal direction of the stripes in a direction forming an angle of from 25° to 55° to the <110> direction or the equivalent direction.

In addition, the scanning direction of the laser beam may not be exactly set in the <110> direction, but may be set in a direction in the range of ±10° relative to the <110> direction.

In the sixthe embodiment, argon laser is used for melting the polycrystalline or amorphous silicon film, but the energy beam for melting the polycrystalline or amorphous silicon is not limited to the argon laser, and the same effect can be obtained also by use of another laser beam, an electron beam or the like.

FIGS. 16A to 16C illustrate a semiconductor device and a process for forming a single crystal film on an insulator film, according to a seventh embodiment of the present invention, wherein FIGS. 16A shows a plan layout of the semiconductor device according to the embodiment, FIG. 16B shows a cross-sectional structure along line B—B of FIG. 16A and the scanning direction of a laser beam, and FIG. 16C shows a cross-sectional structure along line C—C of FIG. 16A. In FIGS. 16A to 16C, the constitution of the semiconductor device is the same as that according to the prior art shown in FIGS. 3A to 3C, except the constitution, as a characteristic feature of the present invention, that both the longitudinal direction of an elongate opening part 73 and the longitudinal direction of stripe portions 76b of a striped anti-reflection film 76 constituted of a silicon nitride film provided by the CVD method in a thickness of 550 Å are set in a direction forming an angle of 33° to the <110> direction or an equivalent direction, namley, in the <510> direction. The polycrystalline silicon layer 74 is converted into a single crystal in the manner as follows. For example, a laser beam 75 supplied from a continuous oscillation tyep argon laser and having a predetermined power density is controlled to have a beam diameter of 100 μm, and irradiation with the laser beam is carried out while scanning in the direction of hollow arrow Y in FIG. 16B, namely, the <510> direction at a velocity of 10 cm/sec. After the first scan of the laser beam 75 is over, the laser beam 75 is shifted 40 μm in a direction perpendicular to the scanning direction, and is again scanned in the direction of arrow Y. The mechanism of converting the polycrstalline silicon layer 74 into a single crystal will not be detailed below.

The power of a laser beam generally shows the so-called Gaussian distribution in which the power is higher at a central part and lower at peripheral parts. However, since the anit-reflection film 76 consisting of a silicon nitride film is provided in the pattern of stripes on the polycrystalline silicon film 74P, the temperature of the polycrystalline silicon film 74P beneath the silicon nitride film 76 is maintained to be higher than the temperature of the polycrystalline silicon film 74P under the reigon where the silicon nitride film 76 is not provided. As a result, in the region irradiated with the laser beam 75, a periodic temperature distribution substantially corresponding to the pitch of the stripe portions 76b is produced in the polycrystalline silicon 74P, whereby the temperature distribution of the Gaussian tyep of the laser beam 75 can be compensated for. Namely, a temperature distribution in which a higher temperature at a part beneath the anti-reflection film 76 and a lower temperature at the gap part between adjacent ones of the stripes 76b are periodically repeated is provided in the polycrystalline silicon film 74P. Under the effect of the anti-reflection film (silicon nitride film) 76, the solidification and recrystallization proceeds from a central part of the lower-temperature region where the anti-reflective film 76 is not provided toward the higher-temperature region where the anti-reflection film 76 is provided. In this case, since the polycrystalline silicon film 74P is in contact with the single crystal silicon of the substrate 71 through the opening parts 73, only the epitaxial growth with the single crystal silicon substrate 71 as a seed proceeds continuously from the opening parts 73 toward the region where the anti-reflection film 76 is not provided, along the longitudinal direction of the stripe portions 76b. Since the longitudinal direction of the stripe portions 76b of the anti-reflection film 76 is set in the <510> direction, the shape of the liquid-solid interface accords with the intersection of (111) plane and (001) plane, whereby a high-quality large-area single crystal layer having few crystalline defects such as stacking faults and having the same crystal face, (001), as that of the single crystal silicon substrate 71 can be obtained.

Although in the seventh embodiment described above the longitudinal direction of the stripe portions 76b of the anti-reflection film 76 is set in the <510> direction on the major surface of the single crystal silicon substrate 71, substantially the same effect can also be obtained where the longitudinal direction of the stripe portions 76b is set in, for example, <410>, <310> or <100> direction. Namely, when the longitudinal direction of the stripes of the anti-reflecdtion film is set in a direction forming an angle of from 25° to 55° to the <110> direction or an equivalent direction on the major surface of the single crystal silicon substrate 71, the distance of epitaxial crystal growth from an end part of the opening part 73 can be greatly increased.

Further, although a silicon nitride film of 550 Å in thickness is used as the anti-reflection film in the seventh embodiment described above, any film constitution that produces the desired temperature distribution in the polycrystalline silicon film to be melted may be employed. For example, the same effect as above can be obtained also by an insulator anti-reflection film of two-layer construction in which a silicon oxide film of 1600 Å in thickness is built up on the polycrystalline silicon film 74P by the CVD method and a silicon nitride film of 550 Å in thickness is provided in the pattern of stripes on the silicon oxide film. Alternatively, a polycrystalline silicon film pattened in a striped form may be provided on a silicon oxide film provided in a thickness of 2000 Å by the CVD method. In that case, since the polycrystalline silicon film provided in the striped pattern absorbs tl.. laser light, the temperature of the polycrystalline silicon film 74P to be melted under the region where the striped polycrystalline silicon film is provided becomes lower than that in the region where the striped polycrystalline silicon film is not provided. Another film constitution may also be used in which a silicon oxide film and a film of a high melting metal, e.g., tungsten are built up on the polycrystalline silicon film to be melted, and the high melting metal is patterned in the shape of stripes. In that case, the high melting film reflects the laser light and, therefore, functions as a reflective film contrary to the anti-reflection film.

The seventh embodiment has been explained above referring to the case of using an argon laser, for example, of the continuous oscillation type, but the same effect can be obtained also by use of another laser light or other energy beam such as an electron beam.

Figure 17A:
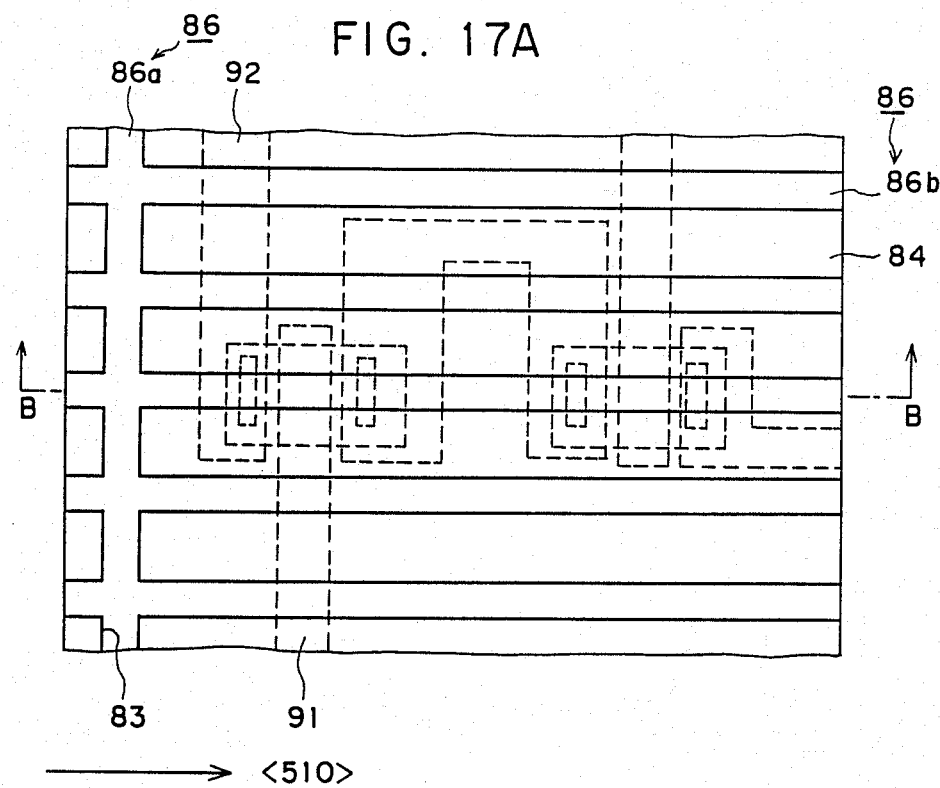
FIGS. 17A and 17B show a plan view and a cross-sectional view taken on line B—B thereof, respectively, of a semiconductor device produced by a eighth embodiment of the present invention.
Figure 17B:
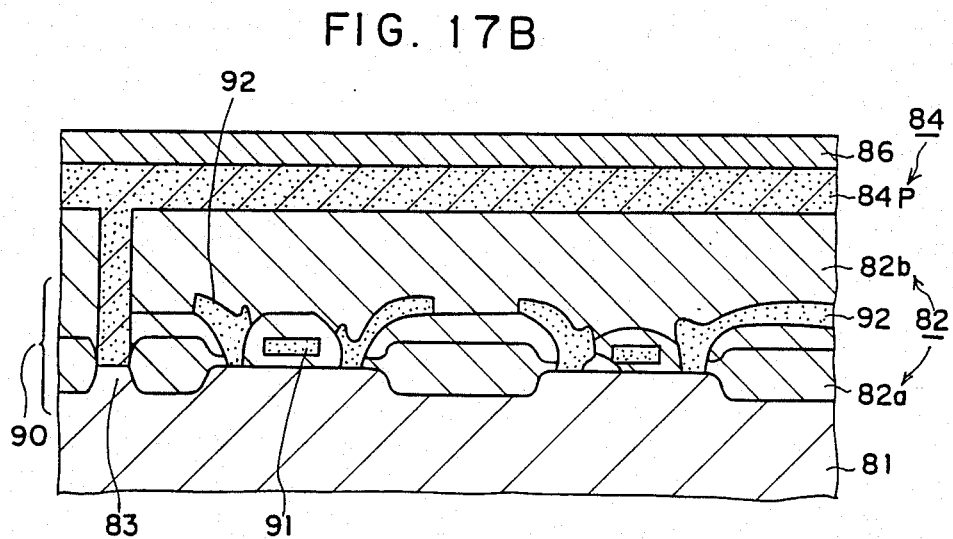

Moreover, a structure may be provided on the major surface of the semiconductor substrate, as in the case of a three-dimensional circuit element. For instance, as in an eighth embodiment shown in FIGS. 17A and 17B, an element 90 such as transistor is provided on a major surface of a single crystal silicon substrate 81 and then polycrystalline silicon 84 and an anti-reflection film 86 are provided thereon through a thick insulator film 82b, whereby the same effect as above can be obtained. Here, FIGS. 17A, 17B illustrate an example of the semiconductor device for realizing the above-mentioned three-dimensional circuit element, wherein FIG. 17A shows a plan alyout, and FIG. 17B shows a cross-sectional structure. In the figures, on the major surface of the single crystal silicon substrate 81 is provided a first-layer circuit element 90 which comprises a thick insulator film for electrical separation of circuit elements, namely, a separating oxide film 82a, gate electrodes 91 for controlling the operation of a MOS transistor, and a wiring 92 consisting, for example, of a high melting metal for mutual connection of circuit elements. A thick insulator film, or oxide film, 82b is provided on the first-layer circuit element 90, and the thick oxide film 82b is provided at a part thereof with an elongate opening part 83 extending to the major surface of the single crystal silicon substrate 81. A polycrystalline silicon film 84P to be melted is provided on the thick oxide insulator film 82b and the opening part 83, and an anti-reflection film 86 is provided on the polycrystalline silicon film 84P in the form of stripes with a predetermined width and at a predetermined interval, with the longitudinal direction of the stripe portions 86b set in, for example, <510> direction. With this arrangement, the polycrystalline silicon film 84P at the opening part 83 is melted by irradiation with a laser beam, and the fusion is caused to reach to the major surface of the single crystal silicon substrate 81, whereby the polycrystalline silicon film 84P at the opening part 83 is epitaxially grown while succeeding to the crystal facial orientation of the single crystal silicon substrate 81 at the opening part 83, and by suing the thus epitaxially grown single crystal film as a seed crystal, epitaxial growth onto the polycrystalline silicon film 84P on the oxide insulator film 82 can be achieved by scanning of the laser beam, thereby achieving the growth of single crystal over a long distance along the <510> direction.

The eight embodiment has been explained above referring to the case of using a polycrystalline silicon film as the semiconductor film to be melted, but the same effect can be obtained also in the case of using an amorphous silicon film.

Further, in the eight embodiment described above, the semiconductor circuit element 90 is not limited to a transistor, and may be other semiconductor elements, e.g., diode or thyristor. By constituting such a semiconductor circuit element 90 as a single crystal semiconductor layer, the intention of the present invention to provide a single crystal semiconductor of high quality can be fulfilled.

As explained in detail hereinabove, according to the process for producing a single crystal semiconductor layer of the present invention, conversion of a polycrystalline semiconductor into a single crystal is so performed that {111} planes which are generally the most stable of planes in a semiconductor crystal of the cubic system are moved in conformity with a liquid-solid interface, or crystal growth plane, whereby it is possible to obviat ecrystal defects arising from grain boundaries, crystal strains or the like. Accordingly, a high-quality large-area single crystal semiconductor layer can be produced, and a semiconductor device provided with such a high-quality large-area single crystal semiconductor layer can be obtained.

In addition, according to the process of the present invention, a substrate comprising a single crystal semiconductor layer, an insulator layer having an opening part and a polycrystalline semiconductor layer and covered by an anti-reflection film or a reflective film having stripes in a predetermined direction is irradiated with an energy beam to melt the polycrystalline semiconductor, and the energy beam is scanned at a predetermined velocity in such a direction that the lqiuid-solid interface in solidification accords with the (111) plane. Accordingly, conversion of the polycrystalline silicon semiconductor into single crystal is performed while the liquid-solid interface, or crystal growth plane, accords with teh most stable (111) plane, so that a high-quality wide-range single crystal semiconductor layer can be grown without generating strains or the like at the interface even under an enhanced scanning velocity of the energy beam, and a semiconductor device comprising such a single crystal semiconductor layer can be obtained.

Moreover, according to the present invention, in a substratative semiconductor device comprising a single crystal semiconductor substrate having a (001) plane or an equivalent crystal face as a major surface, and insulator film provided on the major surface of the substrate and provided at least at a part thereof with an elongate opening part through which the major surface of the single crystal semiconductor substrate is exposed, and a plycrystalline or amorphous semiconductor film to be melted by irradiation with an energy beam which is provided on the insulator layer and the elongate opening part, a reflective film or anti-reflection film for giving a desired temperature distribution in the polycrystalline or amorphous semiconductor film upon irradiation with the energy beam is provided in the form of stripes at a predetermined angle to the <110> direction or an equivalent direction on the major surface of the single crystal semiconductor substrate, whereby a high-quality large-area single crystal semiconductor layer can be formed on the insulator film in a short time.

What is claimed is:

1. A process for producing a single crystal semiconductor layer comprising:

a first step of laminating an insulator layer on a major surface of a single crystal semiconductor substrate of the cubic crystal while leaving an opening part for seeding, and building up a polycrystalline or amorphous semiconductor layer on the entire surface of said insulator layer inclusive of said opening part;

a second step of providing a protective layer for controlling the temperature of said polycrystalline or amorphous semiconductor layer, said protective layer comprising a reflective or anti-reflection film comprising stripes of a predetermined width at a predetermined angle to said opening part and at a regular interval so as to produce a difference in temperature characteristics between parts of said polycrystalline or amorphous semiconductor layer which correspond to gaps between said stripes, thereby completing a base for producing a semiconductor device, and wherein said single crystal semiconductor substrate has a (001) plane or an equivalent crystal face as a major surface, and in said second step said reflective or anti-reflection film is so provided that the longitudinal direction of said stripes of said reflective or anti-reflection film forms a predetermined angle $\theta_1$, to a <110> direction or an equivalent direction on said major surface, and wherein said angle $\theta_1$, satisfies the condition of $25° \leq \theta_1 \leq 55\%$; and a third step of irradiating said polycrystalline or amorphous semiconductor layer with an energy beam through said protective layer of said base to melt said semiconductor layer while scanning said energy beam in such a direction that the liquid-solid interface formed at the time of re-solidification of said melted semiconductor layer accords with at least one (111) plane, namley, {111} plane, or the plane which intersects {111} planes and a horizontal plane thereby converting said polycrystalline or amorphous semiconductor into a single crystal using the single crystal of said substrate making contact with said semiconductor layer at said opening part as a seed crystal.

2. A process according to claim 1, wherein the scanning direction of said third step forms an angle $\theta_2$ to a <110> direction or an equivalent direction on said major surface, which satisfies the condition of $-10° \leq \theta_2 \leq 10°$.

3. A process according to claim 1, wherein the scanning direction of said third step forms an angle $\theta_3$ to the longitudinal direction of said stripes of said reflective or anti-reflection film, which satisfies the condition of $-10° \leq \theta_3 \leq 10°$.

4. A process according to claim 1, wherein each of semiconductors constituting respectively said single crystal semiconductor substrate and said polycrystalline or amorphous semiconductor layer in said first step comprises silicon.

5. A process according to claim 1, wherein said insulator laye rin siad first step comprises silicon dioxide.

6. A process accordin gto claim 1, wherien said insulator layer in said first step comprises a first insulator layer separated by an opening part having a predetermined width in an elongate form and a second insulator layer laminated on said opening part and said first insulator layer so as to surround said polycrystalline or amorphous semiconductor layer disposed to conform to the structure of the semiconductor device to be produced.

7. A process according to claim 6, wherein said first and said second insulator layer each comprise a silicon dioxide film.

8. A process according to claim 6, wherein said first insulator layer comprises a silicon oxide film, and said second insulator layer comprises a silicon nitride film.

9. A process according to claim 1, wherein said protective layer in said second step is constituted solely of said striped reflective or anti-reflection film.

10. A process according to claim 9, wherein said striped reflective or anti-reflection film comprises a silicon nitride film.

11. A process according to claim 1, wherein said protective layer in said second step comprises a first protective layer comprising an oxide film provided in a uniform thickness on said polycrystalline or amorphous semiconductor layer and a second protective layer comprising a reflective or anti-reflection film provided on said first protective laye rin the form of paralle stripes.

12. A process acccording to claim 11, wherein said oxide film as said first protective layer comprises a silicon dioxide film, and said striped reflective or anti-reflection film as said second protective layer comprises a silicon nitride film.

13. A process according to claim 1, wherein said protective layer in said second step comprises a first protective layer comprising an oxide insulator film provided in a predetermined thickness on said polycrystalline or amorphous semiconductor layer, a second protective layer comprising a polycrystalline or amorphous semiconductor film provided on said first protective layer in a predetermined thickness, and a third protective layer comprising a striped reflective or anti-reflection film provided on said second protective layer.

14. A process according to claim 13, wherein said first protective layer comprising said oxide insulator layer comprises a silicon dixodie film, while said second protective layer comprises a polycrystallie or amorphous silicon film, and said third protective layer comprises a reflective or anit-reflective film or silicon dioxide and/or silicon nitride.

15. A process according to claim 1, wherein said energy beam scanned for irradiation therewith in said third step is a continuously oscillated argon laser beam, and at least has a wavelength of either one or 4880 Å and 5145 Å.

16. A process according to claim 1, wherein said energy beam scanned for irradiation therewith is a continuous electron beam.

* * * * *

UNITED STATES PATENT AND TRADEMARK OFFICE
CERTIFICATE OF CORRECTION

PATENT NO. : 4,822,752

DATED : April 18, 1989

INVENTOR(S) : KAZUYUKI SUGAHARA ET AL.

It is certified that error appears in the above-identified patent and that said Letters Patent is hereby corrected as shown below:

```
Col. 5, line 1, after "the" (first occurrence) insert
                --thin--.
Col. 8, line 12, "5" should be --15--;
Col. 8, line 17, "5" should be --15--;
Col. 8, line 23, "5" should be --15--;
Col. 9, line 19, "24A" should be --24S--; same line, "<11̄0>
                should be --<1̄10>--;
Col. 9, line 44, "cast" should be --case--.
Col. 10, line 8, "to" should be --for--;
Col. 10, line 55, "epixtaxial" should be --epitaxial--.
Col. 12, line 28, "constrituion" should be
                --constitution--;
Col. 12, line 37, "hat" should be --heat--.
Col. 13, line 1, "sixthe" should be --sixth--;
Col. 13, line 26, "ley" should be --ly--;
Col. 13, line 29, "tyep" should be --type--;
Col. 13, line 55, "tyep" should be --type--;
Col. 13, line 61, after "film" insert --)--;
Col. 13, line 62, delete ")".
Col. 14, line 22, "anti-refecdtion" should be
                --anti-reflection--;
Col. 14, line 41, "pattened" should be --patterned--.
```

UNITED STATES PATENT AND TRADEMARK OFFICE
CERTIFICATE OF CORRECTION

PATENT NO. : 4,822,752
DATED : April 18, 1989
INVENTOR(S) : KAZUYUKI SUGAHARA ET AL.

It is certified that error appears in the above-identified patent and that said Letters Patent is hereby corrected as shown below:

```
Col. 15, line 7,  "alyout" should be --layout--;
Col. 15, line 35, "suing" should be --using--;
Col. 15, line 48, "element" should be --elements--;
Col. 15, line 63, "obviat" should be --obviate--; same line,
                  "ecrystal" should be --crystal--.
Col. 16, line 14, "teh" should be --the--;
Col. 16, line 29, "plycrystalline" should be
                  --polycrystalline--.
Col. 17, line 3,  "55%" should be --55°--;
Col. 17, line 11, "nameley" should be --namely--;
Col. 17, line 35, "laye rin siad" should be --layer in
                  said--;
Col. 17, line 36, "accordin gto" should be --according
                  to--.
Col. 18, line 16, "laye rin" should be --layer in--; same
                  line, "paralle" should be --parallel--.
Col. 18, line 37, "anit" should be --anti--.
```

Signed and Sealed this

Ninth Day of April, 1991

Attest:

HARRY F. MANBECK, JR.

*Attesting Officer*     *Commissioner of Patents and Trademarks*